US012540399B2

(12) United States Patent
Hirano et al.

(10) Patent No.: US 12,540,399 B2
(45) Date of Patent: Feb. 3, 2026

(54) SUBSTRATE PROCESSING APPARATUS, METHOD OF MANUFACTURING SEMICONDUCTOR DEVICE AND NON-TRANSITORY COMPUTER-READABLE RECORDING MEDIUM

(71) Applicant: Kokusai Electric Corporation, Tokyo (JP)

(72) Inventors: Makoto Hirano, Toyama (JP); Yuji Takebayashi, Toyama (JP)

(73) Assignee: Kokusai Electric Corporation, Tokyo (JP)

( * ) Notice: Subject to any disclaimer, the term of this patent is extended or adjusted under 35 U.S.C. 154(b) by 669 days.

(21) Appl. No.: 17/675,612

(22) Filed: Feb. 18, 2022

(65) Prior Publication Data
US 2022/0170160 A1 Jun. 2, 2022

Related U.S. Application Data

(63) Continuation of application No. PCT/JP2020/027326, filed on Jul. 14, 2020.

(30) Foreign Application Priority Data

Aug. 20, 2019 (JP) .................... 2019-150155

(51) Int. Cl.
*C23C 16/52* (2006.01)
*C23C 16/44* (2006.01)
(Continued)

(52) U.S. Cl.
CPC .......... *C23C 16/52* (2013.01); *C23C 16/4412* (2013.01); *C23C 16/4583* (2013.01); *C23C 16/46* (2013.01)

(58) Field of Classification Search
None
See application file for complete search history.

(56) References Cited

U.S. PATENT DOCUMENTS

2008/0173238 A1 7/2008 Nakashima et al.
2012/0240857 A1* 9/2012 Morozumi ........ H01L 21/67109
118/725
(Continued)

FOREIGN PATENT DOCUMENTS

JP 05-198517 A 8/1993
JP 2007-081365 A 3/2007
(Continued)

OTHER PUBLICATIONS

International Search Report, PCT/JP2020/027326, Oct. 20, 2020, 2 pgs.
(Continued)

*Primary Examiner* — Sarah K Salerno
(74) *Attorney, Agent, or Firm* — Volpe Koenig

(57) ABSTRACT

According to the technique of the present disclosure, there is provided a substrate processing apparatus capable of improving thickness uniformity of a film formed on each substrate. The apparatus includes a substrate retainer; a reaction tube; a vertical driver for moving the substrate retainer into or out of the reaction tube; a heater provided around the reaction tube; a gas supplier having a plurality of gas feeders corresponding to a plurality of substrates, respectively, supported by the substrate retainer; an exhauster through which a gas is exhausted from the reaction tube; and a controller capable of controlling the vertical driver and the gas supplier such that the gas is capable of being supplied through the plurality of gas feeders while maintaining a relative position of a substrate with respect to
(Continued)

a gas feeder corresponding thereto at a first position or at a second position different from the first position.

19 Claims, 11 Drawing Sheets

(51) Int. Cl.
*C23C 16/458* (2006.01)
*C23C 16/46* (2006.01)

(56) References Cited

U.S. PATENT DOCUMENTS

| | | | |
|---|---|---|---|
| 2013/0098455 A1* | 4/2013 | Ng | C23C 16/303 137/561 R |
| 2013/0137272 A1 | 5/2013 | Ishibashi et al. | |
| 2013/0205611 A1* | 8/2013 | Wamura | C23C 16/45563 137/154 |
| 2015/0259796 A1 | 9/2015 | Suzuki et al. | |
| 2017/0309490 A1* | 10/2017 | Ogawa | C23C 16/45529 |
| 2018/0286662 A1 | 10/2018 | Nagatomi et al. | |

FOREIGN PATENT DOCUMENTS

| | | |
|---|---|---|
| JP | 2008-166321 A | 7/2008 |
| JP | 2015-177106 A | 10/2015 |
| KR | 10-2019-0049334 A | 5/2019 |
| WO | 2012/026241 A1 | 3/2011 |

OTHER PUBLICATIONS

Taiwan Office Action, TW Application No. 109126766, Jul. 7, 2021, 19 pgs. (with English Translation).
Korean Office Action issued on Apr. 24, 2024 for Korean Patent Application No. 10-2022-7005370.

* cited by examiner

FIG. 9

| | THICKNESS DISTRIBUTION OF FILM | POSITIONAL RELATIONSHIP BETWEEN SUBSTRATE AND NOZZLE, AND GAS SUPPLY |
|---|---|---|
| 901 — A | CONVEX DISTRIBUTION (CENTRAL PORTION IS THICKER THAN OUTER PERIPHERAL PORTION) | 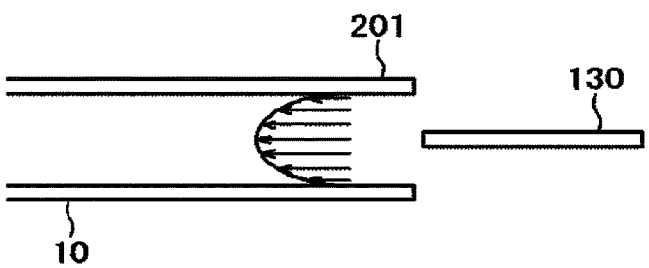 |
| 902 — B | CONCAVE DISTRIBUTION (OUTER PERIPHERAL PORTION IS THICKER THAN CENTRAL PORTION) | 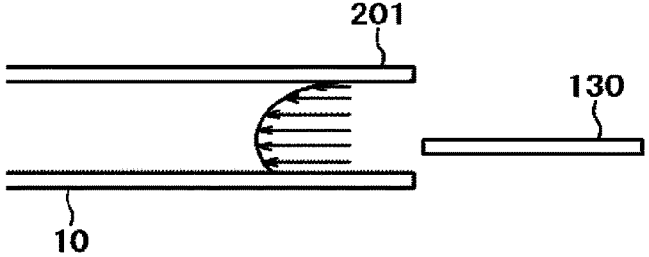 |
| 903 — C | FLAT | - POSITIONAL RELATIONSHIP BETWEEN A AND B OR COMBINATION OF GAS SUPPLY IN A AND GAS SUPPLY IN B |

SUBSTRATE PROCESSING APPARATUS, METHOD OF MANUFACTURING SEMICONDUCTOR DEVICE AND NON-TRANSITORY COMPUTER-READABLE RECORDING MEDIUM

CROSS-REFERENCE TO RELATED PATENT APPLICATION

This application is a bypass continuation application of PCT International Application No. PCT/JP2020/027326, filed on Jul. 14, 2020, in the WIPO, the international application being based upon and claiming the benefit of priority from Japanese Patent Application No. 2019-150155, filed on Aug. 20, 2019, in the Japanese Patent Office, the entire contents of which are hereby incorporated by reference.

BACKGROUND

1. Field

The present disclosure relates to a substrate processing apparatus (which is configured to process a substrate in a manufacturing process of a semiconductor device), a method of manufacturing a semiconductor device and a non-transitory computer-readable recording medium.

2. Related Art

In a heat treatment process of a substrate (also referred to as a "wafer") in a manufacturing process of a semiconductor device, for example, a substrate processing apparatus such as a vertical type substrate processing apparatus may be used. In the vertical type substrate processing apparatus, a plurality of substrates are charged into a substrate retainer of the vertical type substrate processing apparatus and supported in the vertical direction by the substrate retainer, and the substrate retainer is loaded into a process chamber of the vertical type substrate processing apparatus. Thereafter, a process gas is introduced into the process chamber while the process chamber is heated to perform a substrate processing such as a film-forming process on the plurality of substrates. For example, according to some related arts, a substrate processing apparatus provided with a gas ejection port through which a gas such as the process gas is ejected into the process chamber is disclosed. The gas ejection port is of a slot shape so as to span at least a plurality of substrates including the substrate in a direction perpendicular to a processing surface of the substrate.

SUMMARY

According to the present disclosure, there is provided a technique related to a substrate processing apparatus, a method of manufacturing a semiconductor device and a non-transitory computer-readable recording medium capable of improving a thickness uniformity of a film formed on each of a plurality of substrates when the plurality of substrates are processed simultaneously.

According to one or more embodiments of the present disclosure, there is provided a technique related to a substrate processing apparatus including: a substrate retainer configured to support a plurality of substrates in a vertical direction; a reaction tube in which the substrate retainer supporting the plurality of substrates is accommodated; a vertical driver configured to move the substrate retainer into the reaction tube or out of the reaction tube; a heater provided around the reaction tube and configured to heat the plurality of substrates; a gas supplier provided with a plurality of gas feeders corresponding to the plurality of substrates, respectively, supported by the substrate retainer accommodated in the reaction tube; an exhauster through which a gas supplied through the gas supplier is exhausted from the reaction tube; and a controller configured to be capable of controlling at least the vertical driver and the gas supplier such that the gas is capable of being supplied through the plurality of gas feeders while maintaining a relative position of a substrate among the plurality of substrates with respect to a gas feeder among the plurality of gas feeders corresponding to the substrate at a first position or at a second position different from the first position.

BRIEF DESCRIPTION OF THE DRAWINGS

FIG. 9 is a table schematically illustrating a relationship between a thickness distribution of a film formed on the substrate and height positions of the substrate and the gas supply nozzle in the substrate processing apparatus according to the first embodiment.

DETAILED DESCRIPTION

Figure 1:
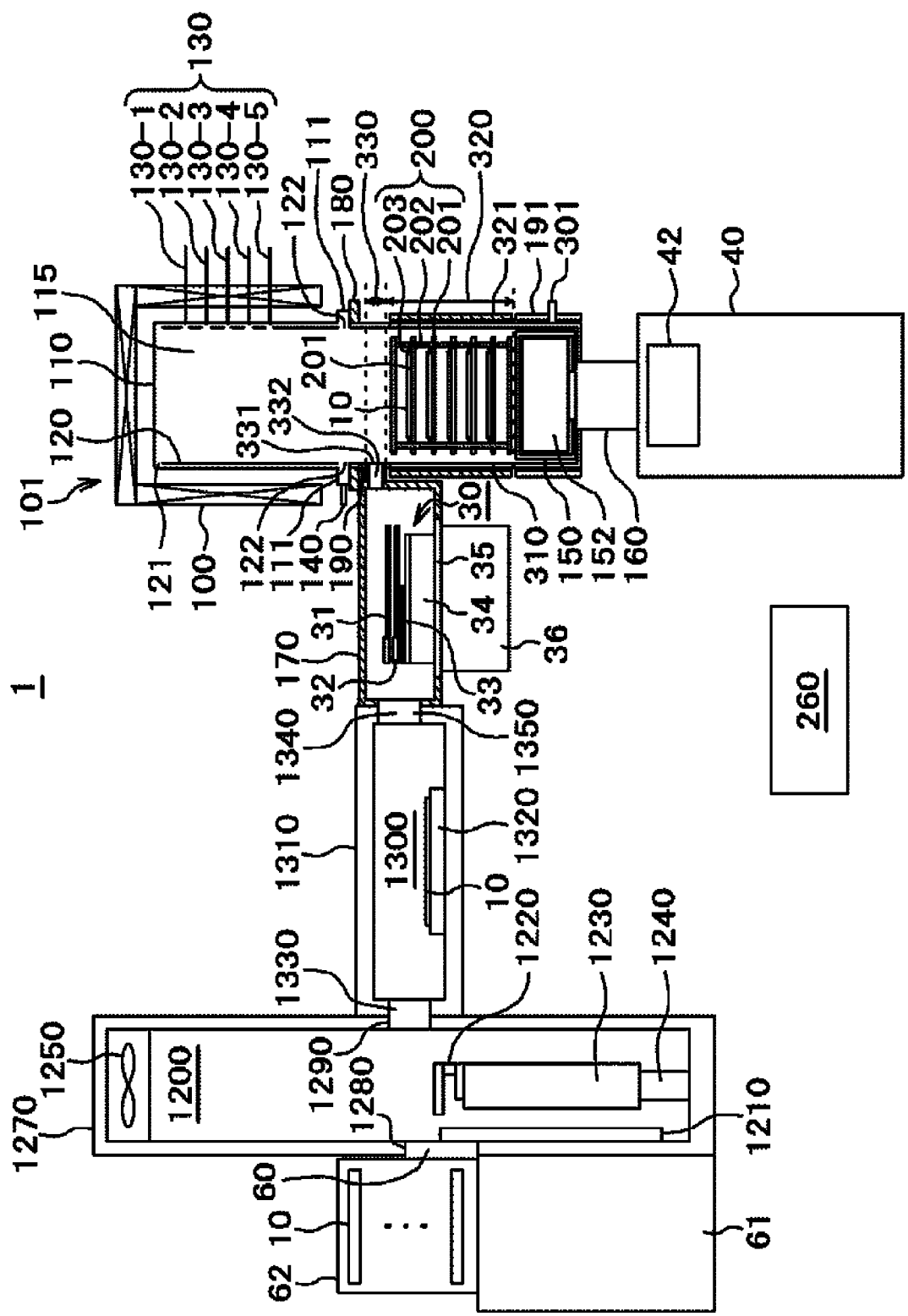
FIG. 1 is a diagram schematically illustrating a configuration of a substrate processing apparatus according to a first embodiment of the present disclosure.

The present disclosure relates to a technique capable of adjusting properties of a film formed on a substrate using a reaction chamber structure of a heat process furnace in which a film-forming gas is supplied to a plurality of substrates including the substrate installed in a multi-stage manner in the vertical direction through a gas feeder installed corresponding to a side surface of the substrate. For example, in the reaction chamber structure, by changing a relationship between the gas feeder and a height of the substrate, it is possible to change a gas supply state (for example, a flow velocity and a temperature) on a surface of the substrate. For example, in the reaction chamber structure, by changing the gas supply state (for example, the flow velocity and the temperature) on the surface of the substrate, it is possible to change an active state of a gas contributing to a film-forming process (that is, the film-forming gas). Thereby, it is possible to adjust the properties of the film formed on the substrate.

The present disclosure also relates to the technique capable of improving a thickness uniformity of the film formed on each of the plurality of substrates when the plurality of substrates are processed simultaneously by using a substrate processing apparatus. For example, the substrate processing apparatus includes: a substrate support on which a substrate is placed; a process chamber in which the substrate placed on the substrate support is processed; a transfer chamber communicating with a lower portion of the process chamber and through which the substrate is placed on the substrate support; a heating chamber communicating with a lower portion of the transfer chamber and in which the substrate and the substrate support are heated; and an elevator configured to move the substrate support among the process chamber, the transfer chamber and the heating chamber. In the substrate processing apparatus, it is possible to adjust a relative height relationship between the substrate and a gas supply hole when the substrate is being processed such that the gas supply state on the surface of the substrate is adjusted according to a surface area of the substrate or a type of the film to be formed (or a type of the gas).

The present disclosure also relates to the technique capable of improving the thickness uniformity of the film formed on each of the plurality of substrates when the plurality of substrates are processed simultaneously in a substrate processing method (that is, a method of manufacturing a semiconductor device) by using a substrate processing apparatus. For example, the substrate processing apparatus includes: a substrate support on which a substrate is placed; a process chamber provided with a gas supplier (which is a gas supply structure) through which a gas is supplied to the substrate placed on the substrate support; a transfer chamber communicating with a lower portion of the process chamber and through which the substrate is placed on the substrate support; a heating chamber communicating with a lower portion of the transfer chamber and in which the substrate and the substrate support are heated; and an elevator configured to move the substrate support among the process chamber, the transfer chamber and the heating chamber. In the substrate processing method, when the substrate placed on the substrate support is processed in the process chamber, the film is formed on each of the plurality of substrates by changing the gas supply state on the surface of the substrate by changing a relative height relationship between the gas supplier and the substrate.

Embodiments

Hereinafter, embodiments according to the technique of the present disclosure will be described with reference to the drawings.

First Embodiment

A configuration of a semiconductor manufacturing apparatus according to a first embodiment of the technique of the present disclosure will be described with reference to FIG. 1. The semiconductor manufacturing apparatus according to the present embodiment is configured as a vertical type substrate processing apparatus (hereinafter, simply referred to as a "substrate processing system") 1 capable of performing a substrate processing such as a heat treatment process. The substrate processing is performed as a part of a manufacturing process in a method of manufacturing a semiconductor device. The substrate processing system 1 according to the first embodiment is configured to process a plurality of substrates including a substrate 10. Hereinafter, the plurality of substrates including the substrate 10 may also be simply referred to as substrates 10. As shown in FIG. 1, the substrate processing system 1 is constituted mainly by an I/O stage (input/output stage) 61, an atmospheric transfer chamber 1200, a load lock chamber 1300, a vacuum transfer chamber 170 and a substrate processing apparatus 101.

Figure 2A:
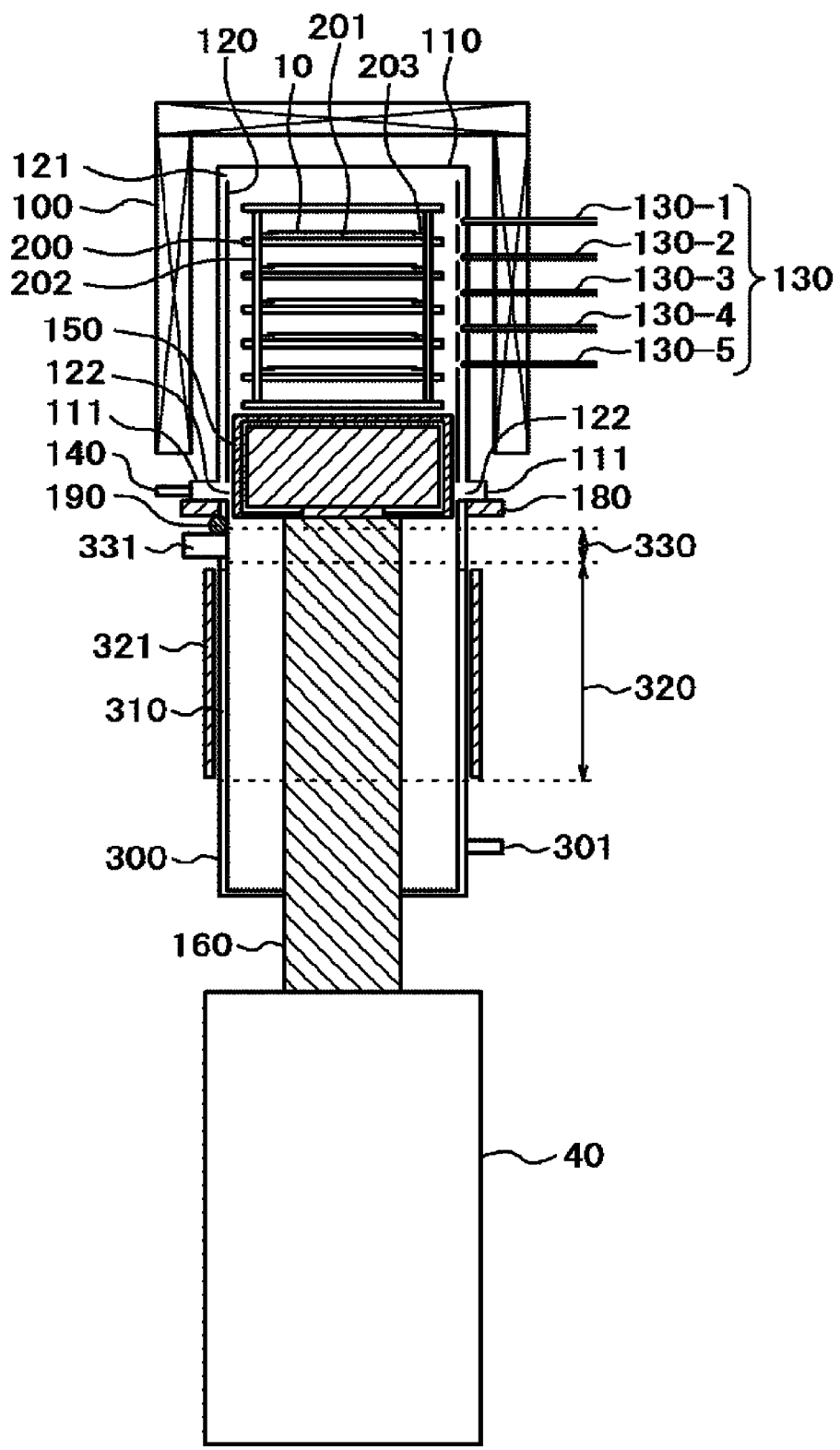
FIG. 2A is a diagram schematically illustrating a cross-section of a process chamber and a boat storage chamber when a boat accommodating a plurality of substrates is transferred into the process chamber of the substrate processing apparatus according to the first embodiment.

FIG. 1 schematically illustrates a state in which a boat 200 supporting the substrates 10 is lowered into a storage chamber 300 provided below a chamber 180 on a side of the vacuum transfer chamber 170, and FIG. 2A, which is a diagram illustrating a part of FIG. 1, schematically illustrates a state in which the boat 200 serving as a substrate support is elevated into a first reaction tube 110. In the present specification, the vacuum transfer chamber 170 may also be referred to as a "transfer module 170". In addition, the substrate processing apparatus 101 may also be referred to as a "process module 101". Hereinafter, each configuration will be described in detail.

<Atmospheric Transfer Chamber 1200 and I/O Stage 61>

The I/O stage (also referred to as a "loading port shelf") 61 is provided right in front of the substrate processing system 1. The I/O stage 61 is configured such that a plurality of pods including a pod 62 serving as a container can be placed on the I/O stage 61. Hereinafter, the plurality of pods including the pod 62 may also be simply referred to as pods 62. The pod 62 is used as a carrier for transferring the substrate 10 such as a silicon (Si) substrate. The pod 62 is configured such that the substrates (wafers) 10 can be accommodated in a multistage manner in a horizontal orientation in the pod 62. In addition, for example, a maximum of 25 substrates may be stored in the pod 62 as the substrates 10.

A cap 60 is installed at the pod 62. The cap 60 can be opened or closed by a pod opener 1210 described later. The pod opener 1210 is configured to open and close the cap 60 of the pod 62 placed on the I/O stage 61. When the pod opener 1210 opens a substrate loading/unloading port 1280 of the pod 62, the substrate 10 can be transferred (loaded) into or transferred (unloaded) out of the pod 62. The pod 62 is provided to or discharged from the I/O stage 61 by an in-process transfer device (not shown) such as a rail guided vehicle (RGV).

The I/O stage 61 is provided adjacent to the atmospheric transfer chamber 1200. The load lock chamber 1300, which will be described later, is connected to a side of the atmospheric transfer chamber 1200 other than a side at which the I/O stage 61 is provided.

An atmospheric transfer robot 1220, which serves as a first transfer robot configured to transfer the substrate 10, is provided in the atmospheric transfer chamber 1200. As shown in FIG. 1, the atmospheric transfer robot 1220 is configured to be elevated or lowered by an elevator 1230 installed in the atmospheric transfer chamber 1200 and to be reciprocated laterally by a linear actuator 1240.

As shown in FIG. 1, a clean air supplier (which is a clean air supply structure of a clean air supply system) 1250 capable of supplying clean air is installed above the atmospheric transfer chamber 1200.

As shown in FIG. 1, the substrate loading/unloading port 1280 (which is configured to transfer the substrate 10 into or out of the atmospheric transfer chamber 1200) and the pod opener 1210 are provided at a front side of a housing 1270 of the atmospheric transfer chamber 1200. The I/O stage (that it, the loading port shelf) 61 is provided at the pod opener 1210 with the substrate loading/unloading port 1280 interposed therebetween. That is, the I/O stage 61 is provided outside the housing 1270.

A substrate loading/unloading port 1290 configured to transfer the substrate 10 into or out of the load lock chamber 1300 is provided at a rear side of the housing 1270 of the atmospheric transfer chamber 1200. The substrate loading/unloading port 1290 is opened or closed by a gate valve 1330 which will be described later. When the substrate loading/unloading port 1290 is opened by the gate valve 1330, the substrate 10 can be loaded into the load lock chamber 1300 or unloaded out of the load lock chamber 1300.

<Load Lock (L/L) Chamber 1300>

The load lock chamber 1300 is provided adjacent to the atmospheric transfer chamber 1200. The vacuum transfer chamber 170, which will be described later, is provided at a side of a housing 1310 constituting the load lock chamber 1300 other than a side of the housing 1310 that is adjacent to the atmospheric transfer chamber 1200. Since an inner pressure of the housing 1310 is adjusted according to an inner pressure of the atmospheric transfer chamber 1200 or an inner pressure of the vacuum transfer chamber 170, the load lock chamber 1300 is constructed to withstand a negative pressure.

A substrate loading/unloading port 1340 is provided at the side of the housing 1310 adjacent to the vacuum transfer chamber 170. The substrate loading/unloading port 1340 is opened or closed by a gate valve 1350. When the substrate loading/unloading port 1340 is opened by the gate valve 1350, the substrate 10 can be loaded into the vacuum transfer chamber 170 or unloaded out of the vacuum transfer chamber 170.

A substrate mounting table 1320 on which the substrate 10 can be placed is provided in the load lock chamber 1300.

<Vacuum Transfer Chamber 170>

The substrate processing system 1 includes the vacuum transfer chamber (transfer module) 170, that is, a transfer space (transfer chamber) in which the substrate 10 is transferred under a negative pressure. For example, the load lock chamber 1300 and the substrate processing apparatus 101 configured to process the substrates 10 are connected to respective sides of the vacuum transfer chamber 170. A transfer device 30 serving as a vacuum transfer robot capable of transferring the substrate 10 under the negative pressure is provided at approximately a center of the vacuum transfer chamber 170 with a flange 35 as a base.

As shown in FIG. 1, the transfer device 30 serving as the vacuum transfer robot provided in the vacuum transfer chamber 170 is configured to be elevated and lowered by an elevator 36 while maintaining the vacuum transfer chamber 170 airtight by the flange 35.

<Substrate Processing Apparatus 101>

The substrate processing apparatus 101 includes: a reaction tube constituted by the first reaction tube 110 of a cylindrical shape extending in the vertical direction and a second reaction tube 120 provided at an inner side of the first reaction tube 110; a heater 100 serving as a first heating structure (heating element) installed on an outer periphery of the first reaction tube 110; and a nozzle structure 130 through which the gas is supplied. For example, the heater 100 is constituted by a zone heater which is vertically divided into a plurality of heater structures (blocks) and a temperature of each heater structure can be set individually.

For example, each of the first reaction tube 110 and the second reaction tube 120 constituting the reaction tube is made of a material such as quartz and silicon carbide (SiC). An inner atmosphere of the first reaction tube 110 is hermetically sealed with respect to an outside air by a component such as a seal (not shown), and a process chamber 115 is defined by an inside of the second reaction tube 120.

In the present specification, the first reaction tube 110 may also be referred to as an "outer cylinder", an "outer tube" or an "outer reaction tube". The second reaction tube 120 may also be referred to as an "inner cylinder", an "inner tube" or an "inner reaction tube". While the present embodiment will be described by way of an example in which the reaction tube is constituted by the first reaction tube 110 and the second reaction tube 120, the present embodiment is not limited thereto. For example, even when the reaction tube is constituted by the first reaction tube 110 alone, the technique of the present disclosure can be applied.

<Gas Supplier>

The nozzle structure 130 serving as a gas supplier (which is a gas supply structure or a gas supply system) includes nozzles 130-1, 130-2, 130-3, 130-4 and 130-5, which penetrate the heater 100 and through which the gas is supplied into the second reaction tube 120. Hereinafter, the nozzle structure 130 may also be simply referred to as a "nozzle 130". By forming the nozzles to penetrate the heater 100 as described above, it is possible to adjust a decomposition state of the gas supplied to the substrate 10. Further, while the nozzle 130 is configured as a pipe shape, the nozzle may be configured as a plurality of gas feeders. In the present embodiment, preferably, each of the plurality of gas feeders is of a pipe shape similar to the nozzle 130. Preferably, the nozzle 130 may be embodied by a structure in which the nozzles 130-1, 130-2, 130-3, 130-4 and 130-5 are assembled, or a structure of a block shape and the like provided with a plurality of through-holes.

Since configurations of the nozzles 130-1 through 130-5 constituting the nozzle 130 are substantially the same, an exemplary configuration of the nozzle 130-1 will be described with reference to FIG. 3, and descriptions of the nozzles 130-2, 130-3, 130-4 and 130-5 are omitted. A source gas, a reactive gas and an inert gas (carrier gas) are introduced into the second reaction tube 120 through the nozzle 130-1. A vertical interval between adjacent nozzles among the nozzles 130-1 through 130-5 is set to be the same as a vertical interval between adjacent substrates among the substrates 10 accommodated in the boat 200.

Figure 3:
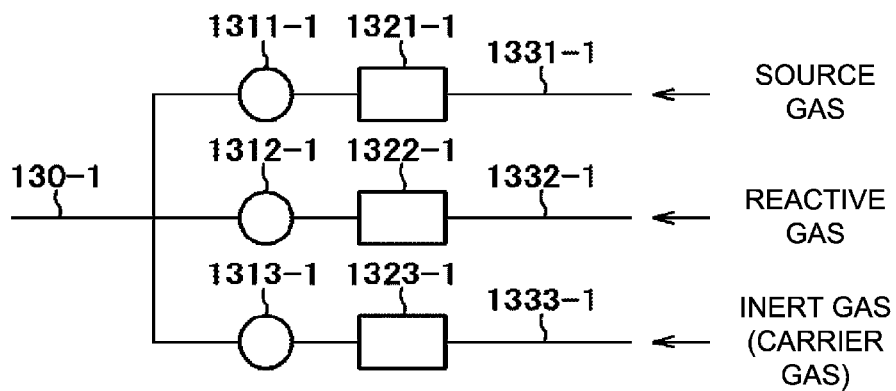
FIG. 3 is a block diagram schematically illustrating a detailed configuration of a gas supplier of the substrate processing apparatus according to the first embodiment of the present disclosure.

As shown in FIG. 3, a flow rate of the source gas supplied into a gas supply pipe 1331-1 from a source gas supply source (not shown) is adjusted by a mass flow controller (MFC) 1321-1 serving as a part of a flow rate controller. Then, the source gas with the flow rate thereof adjusted is supplied into the second reaction tube 120 through the nozzle 130-1 via a valve 1311-1. In the present embodiment, the flow rate controller for the source gas may include the MFC 1321-1 alone, or may further include a valve such as the valve 1311-1.

A flow rate of the reactive gas supplied into a gas supply pipe 1332-1 from a reactive gas supply source (not shown) is adjusted by a mass flow controller (MFC) 1322-1. Then, the reactive gas with the flow rate thereof adjusted is supplied into the second reaction tube 120 through the nozzle 130-1 via a valve 1312-1.

A flow rate of the inert gas (carrier gas) supplied into a gas supply pipe 1333-1 from an inert gas supply source (not shown) is adjusted by a mass flow controller (MFC) 1323-1. Then, the inert gas with the flow rate thereof adjusted is supplied into the second reaction tube 120 through the nozzle 130-1 via a valve 1313-1.

Further, the heater 100 may be constituted by a zone heater which includes a plurality of zones divided in the vertical direction such that a temperature of each zone can be controlled in the vertical direction.

In the present embodiment, the nozzle 130 may also be referred to as a "process gas supply nozzle". Further, while the present embodiment will be described by way of an example in which the source gas and the reactive gas (which serve as a process gas) are supplied through the same nozzle 130, the present embodiment is not limited thereto. For example, even when the source gas and the reactive gas are supplied through different nozzles, respectively, the technique of the present disclosure can be applied. Specifically, a nozzle through which the source gas is supplied and a nozzle through which the reactive gas is supplied are provided for the substrate 10. In addition, the nozzle 130 may be configured to extend in a direction parallel to the substrate 10.

<Substrate Support>

As shown in FIG. 1, the boat 200 serving as the substrate support is supported by a support rod 160 via a heat insulator 150. In the boat 200, the substrates (for example, five substrates) 10 are vertically arranged and supported in a multistage manner by placing the substrates 10 on a substrate support structure 203 attached to a plurality of support columns 202 in a space partitioned by a plurality of disks 201. For example, a vertical interval (distance) between an uppermost substrate and a lowermost substrate among the substrates 10 supported in a multistage manner in the vertical direction is set to about 60 mm.

For example, the boat 200 is made of a material such as quartz and SiC. A substrate retaining structure is constituted by the heat insulator 150 and the boat 200. When the substrates 10 are processed, the boat 200 is accommodated in the second reaction tube 120 as shown in FIG. 2A. While the present embodiment will be described by way of an example in which the five substrates 10 are supported in the boat 200, the present embodiment is not limited thereto. For example, the boat 200 may be configured to support about 5 substrates to 50 substrates as the substrates 10. In addition, the plurality of disks 201 may also be referred to as "separators".

<Heat Insulator 150>

The heat insulator 150 is configured such that the conduction or transmission of the heat tends to be reduced in the vertical direction. In addition, a cavity may be provided in the heat insulator 150. For example, as shown in the drawing, a hole 151 may be provided on a lower surface of the heat insulator 150. By providing the hole 151, it is possible to prevent a pressure difference from occurring between an inside and an outside of the heat insulator 150, and it is also possible to prevent a wall of the heat insulator 150 from thickening. In addition, a cap heater 152 may be provided in the heat insulator 150.

The boat 200 is arranged inside the storage chamber 300. A boat elevator 40 serving as an elevator (also referred to as a "vertical driver" or an "elevation driver") of the boat 200 is provided outside the storage chamber 300, for example, below the storage chamber 300.

The transfer device 30 serving as the vacuum transfer robot capable of transferring the substrate 10 between the load lock chamber 1300 and the chamber 180 is provided inside the vacuum transfer chamber 170 with the flange 35 as a base.

The transfer device 30 is constituted by components such as tweezers 31 configured to support the substrate 10, an arm 32 capable of expanding and contracting, a rotating shaft 33, a base 34, the flange 35 and the elevator 36. It is possible to maintain the vacuum transfer chamber 170 airtight by the flange 35. By operating the transfer device 30 by the elevator 36, it is possible to transfer the substrate 10 between the load lock chamber 1300 and the boat 200.

<Chamber 180>

The chamber 180 is provided under the second reaction tube 120, and includes the storage chamber 300. For example, the storage chamber 300 is constituted by a transfer chamber 330 and a heating chamber 320. The transfer chamber 330 is configured as a space in which the substrate 10 is placed (mounted) on the boat 200 and taken out. The heating chamber 320 is configured as a space in which the substrate 10 placed on the boat 200 is heated. The heat insulator 150 supported by the support rod 160 is accommodated in a lower portion of the chamber 180.

A vertical length of the transfer chamber 330 is set to be shorter than a vertical length of the heating chamber 320. In other words, the vertical length of the heating chamber 320 is set to be longer than the vertical length of the transfer chamber 330. By such a length relationship, it is possible to shorten a time from placing the substrate 10 on the boat 200 to heating the substrate 10, which will be described later.

A cooling flow path 190 may be provided at a substrate loading/unloading port 331. In such a case, the heat from the boat 200 heated by the heater 100, the heater 100 and a heating structure (which is a preheating heater) 321 may be transferred to the cooling flow path 190. As a result, a temperature elevation rate of a new substrate 10 (which refers to a substrate to be processed after the substrate 10 is processed) described later may be lowered.

By such a length relationship described above, it is possible to dispose the new substrate 10 away from a low temperature region near the cooling flow path 190, and it is also possible to improve the temperature elevation rate of the new substrate 10. In addition, the vertical length of the heating chamber 320 may refer to an entire length of a structure including the heat insulator 150 and a substrate placing region of the boat 200.

In the present embodiment, the chamber 180 is made of a metal material such as stainless steel (SUS) and aluminum (Al). In such a case, the storage chamber 300 of the chamber 180 may be expanded by the heating chamber 320. In such a case, as shown in FIG. 1, a cooling flow path 191 may be provided outside the storage chamber 300 of the chamber 180 such that the storage chamber 300 can be cooled.

Further, an inert gas supply pipe 301 through which the inert gas is supplied is provided in the storage chamber 300 of the chamber 180. By supplying the inert gas into the storage chamber 300 through the inert gas supply pipe 301, it is possible to adjust an inner pressure of the storage chamber 300 higher than an inner pressure of the first reaction tube 110. With such a configuration, it is possible to prevent (or suppress) the process gas supplied to the process chamber 115 inside the first reaction tube 110 from entering the storage chamber 300.

<Heating Chamber 320>

The heating chamber 320 refers to the space in which the substrate 10 is heated by the boat 200 or the heating structure 321 described later, and is provided below the transfer chamber 330. As shown in FIG. 2A, the heating chamber 320 may be provided with a window (for example, made of quartz) 310 capable of transmitting an infrared light. The heating structure 321 constituted by a plurality of lamp heaters whose longitudinal directions are aligned in the vertical direction may be installed outside the window 310.

While the present embodiment will be described by way of an example in which the plurality of lamp heaters are used as the heating structure 321, the heating structure 321 is not limited thereto. For example, the heating structure 321 may be constituted by a resistance heater or a plurality of resistance heaters. For example, in the present embodiment, the heating structure 321 or the window 310 may not be provided. Even when the heating structure 321 or the window 310 is not provided, it is possible to heat the substrate 10 by the boat 200 heated by the heater 100.

<Transfer Chamber 330>

In the transfer chamber 330, the substrate 10 placed on the boat 200 is transferred (taken out) from the boat 200 via the substrate loading/unloading port 331 using the transfer device 30, and the new substrate 10 is placed on the boat 200. In addition, the substrate loading/unloading port 331 is provided with a gate valve (GV) 332 configured to separate the transfer chamber 330 from the chamber 180.

The support rod 160 is supported by the boat elevator 40. The boat elevator 40 is driven to move the support rod 160 up and down to transfer the boat 200 into and out of the second reaction tube 120. The support rod 160 is connected to a rotation driver 42 provided at the boat elevator 40. By rotating the support rod 160 by the rotation driver 42, it is possible to rotate the heat insulator 150 and the boat 200.

Figure 2B:
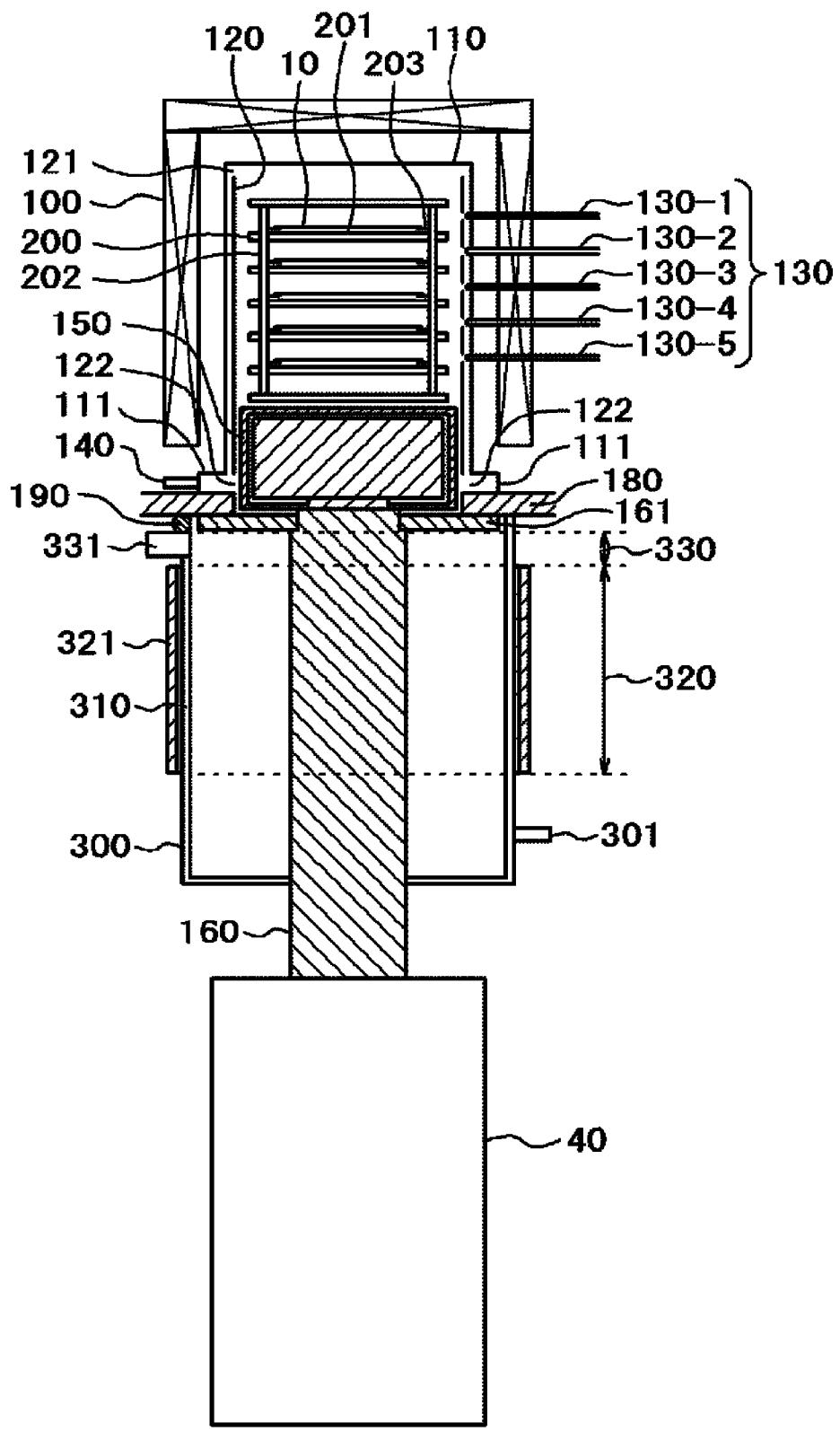
FIG. 2B is a diagram schematically illustrating the process chamber and the boat storage chamber provided with a configuration in which a lid configured to close a lower portion of a reaction tube is provided near an upper end of a rod when the boat accommodating the plurality of substrates is transferred into the process chamber of the substrate processing apparatus according to the first embodiment.

As shown in FIG. 2B, a lid 161 configured to close a lower portion of the reaction tube may be provided near an upper end of the support rod 160 and below the heat insulator 150. By providing the lid 161 and closing the lower portion of the reaction tube, it is possible to prevent the process gas existing in the reaction tube from diffusing into the transfer chamber 330. In addition, it is possible to easily control an inner pressure of the reaction tube, and it is also possible to improve a processing uniformity of the substrate 10. The support rod 160 and the lid 161 may be configured to be operable separately. By configuring the support rod 160 and the lid 161 to be operable separately, it is possible to elevate or lower the support rod 160 while the lower portion of the reaction tube is closed.

The substrate processing system 1 supplies the gas (that is, the process gas) used for the substrate processing through the nozzles 130-1 through 130-5 constituting the nozzle 130 in the second reaction tube 120. The gas supplied through the nozzle 130 may be appropriately changed in accordance with the type of the film to be formed. Gases such as the source gas, the reactive gas and the inert gas are supplied into the second reaction tube 120 through the nozzles 130-1 through 130-5 constituting the nozzle 130.

On the other hand, among the gases supplied through the nozzle 130 into the second reaction tube 120, the reactive gas which did not contribute to the formation of the film passes through a gap 121 provided between the second reaction tube 120 and an upper portion of the first reaction tube 110 and a plurality of openings 122 provided between the second reaction tube 120 and a lower portion of the first reaction tube 110. Then, the reactive gas is exhausted to an outside of the substrate processing system 1 by an exhaust pump (not shown) through an exhaust pipe 140 serving as an exhaust structure.

A pumping structure 111 is provided at a lower end portion of the first reaction tube 110. By providing the pumping structure 111 below the heater 100, it is possible to secure a heat equalizing region by the heater 100. The heat equalizing region is provided in the first reaction tube 110 and above the pumping structure 111.

The plurality of openings 122 of the second reaction tube 120 are provided at a plurality of locations, respectively, around a position where the pumping structure 111 is arranged.

The boat 200 serving as a substrate retainer is constituted by: the plurality of support columns 202 provided vertically; the plurality of disks 201 supported by the plurality of support columns 202, respectively, with regular gaps therebetween; and the substrate support structure 203.

For example, the boat 200 is configured to align the substrates 10 (for example, 5 substrates) in the vertical direction so as to support the substrates 10 in a multistage manner while the substrates 10 are horizontally oriented with their centers aligned with each other. That is, the boat 200 supports the substrates 10 with regular gaps therebetween. For example, the boat 200 is made of a heat resistant material such as quartz and SiC.

It is preferable to minimize an inner diameter of the second reaction tube 120 as long as the boat 200 can be safely transferred into and out of the second reaction tube 120.

<Controller 260>

Figure 4:
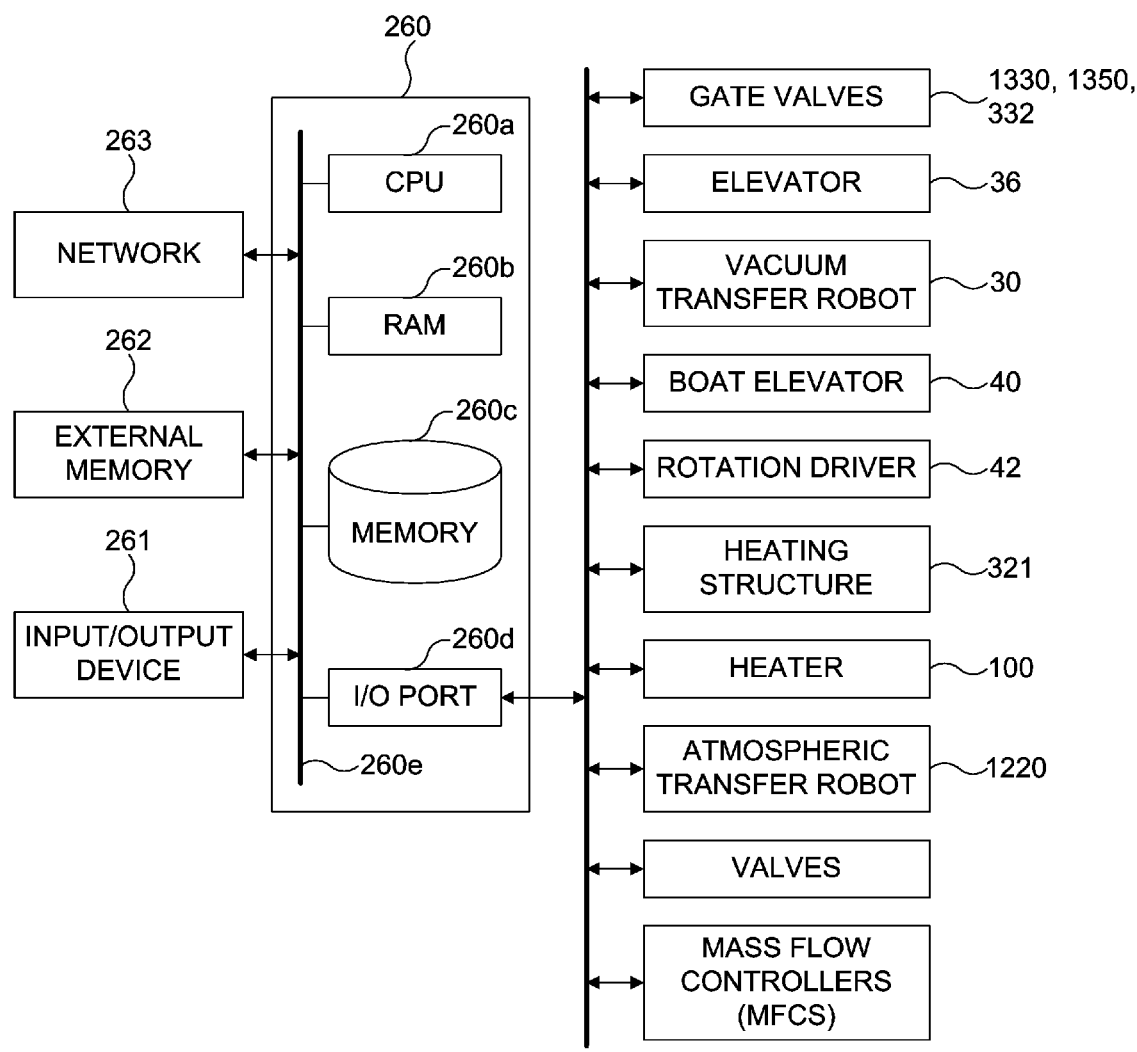
FIG. 4 is a block diagram schematically illustrating a configuration of a controller configured to control operations of components constituting the substrate processing apparatus according to the first embodiment.

As shown in FIGS. 1 and 4, the substrate processing apparatus 101 or the substrate processing system 1 includes a controller 260 configured to control operations of components constituting the substrate processing apparatus 101 or the substrate processing system 1.

The controller 260 is schematically illustrated in FIG. 4. The controller 260 serving as a control apparatus (control structure) is constituted by a computer including a CPU (Central Processing Unit) 260a, a RAM (Random Access Memory) 260b, a memory 260c and an I/O port 260d. The RAM 260b, the memory 260c and the I/O port 260d may exchange data with the CPU 260a through an internal bus 260e. For example, an input/output device 261 configured by a component such as a touch panel and an external memory 262 may be connected to the controller 260.

The memory 260c is configured by components such as a flash memory and a hard disk drive (HDD). For example, a control program configured to control the operation of the substrate processing apparatus 101, a process recipe containing information on sequences and conditions of the substrate processing described later, or a database may be readably stored in the memory 260c.

The process recipe is obtained by combining steps of the substrate processing described later such that the controller 260 can execute the steps to acquire a predetermined result, and functions as a program.

Hereafter, the process recipe and the control program may be collectively or individually referred to as a "program". Thus, in the present specification, the term "program" may refer to the process recipe alone, may refer to the control program alone, or may refer to both of the process recipe and the control program. The RAM 260b functions as a memory area (work area) where a program or data read by the CPU 260a is temporarily stored.

The I/O port 260d is electrically connected to the components such as the gate valves 1330, 1350 and 332, the elevator 36, the vacuum transfer robot (transfer device) 30, the boat elevator 40, the rotation driver 42, the heating structure 321, the heater 100, the atmospheric transfer robot 1220, the valves 1311-1 through 1313-1, the MFCs 1321-1 through 1323-1, a pressure regulator (not shown) and a vacuum pump (not shown). In addition, the I/O port 260d may be electrically connected to components such as the load lock chamber 1300.)

In addition, in the present specification, "electrically connected" means that the components are connected by physical cables or the components are capable of communicating with one another to transmit and receive signals (electronic data) to and from one another directly or indirectly. For example, a device for relaying the signals or a device for converting or computing the signals may be provided between the components.

The CPU 260a is configured to read and execute the control program from the memory 260c and read the process recipe from the memory 260c in accordance with an instruction such as an operation command inputted from the controller 260. The CPU 260a is configured to control various operations in accordance with the process recipe such as opening and closing operations of the gate valves 1330, 1350 and 332, an elevating and lowering operation of the elevator 36, an elevating and lowering operation of the boat elevator 40, a rotating operation of the rotation driver 42, an operation of supplying electrical power to the heater 100, an operation of supplying the electrical power to the heating structure 321, an operation of the transfer device 30 serving as the vacuum transfer robot and an operation of the atmospheric transfer robot 1220.

The controller 260 is not limited to a dedicated computer. The controller 260 may be embodied by a general-purpose computer. For example, the controller 260 according to the present embodiment may be embodied by preparing the external memory 262 (e.g., a magnetic tape, a magnetic disk such as a flexible disk and a hard disk, an optical disk such as a CD and a DVD, a magneto-optical disk such as an MO, a semiconductor memory such as a USB memory and a memory card) in which the above-described program is stored, and installing the program onto the general-purpose computer using the external memory 262.

The method of providing the program to the computer (general-purpose computer) is not limited to the external memory 262. For example, the program may be directly provided to the computer by a communication instrument such as a network 263 (Internet and a dedicated line) instead of the external memory 262. The memory 260c and the external memory 262 may be embodied by a non-transitory computer-readable recording medium. Hereinafter, the memory 260c and the external memory 262 are collectively or individually referred to as a recording medium. In the present specification, the term "recording medium" may refer to the memory 260c alone, may refer to the external memory 262 alone, or may refer to both of the memory 260c and the external memory 262.

Hereinafter, the substrate processing (film-forming process) of forming the film on the substrate 10 by using the substrate processing apparatus 101 described with reference to FIGS. 1 through 4 will be described.

<Substrate Processing (Film-Forming Process)>

Figure 5:
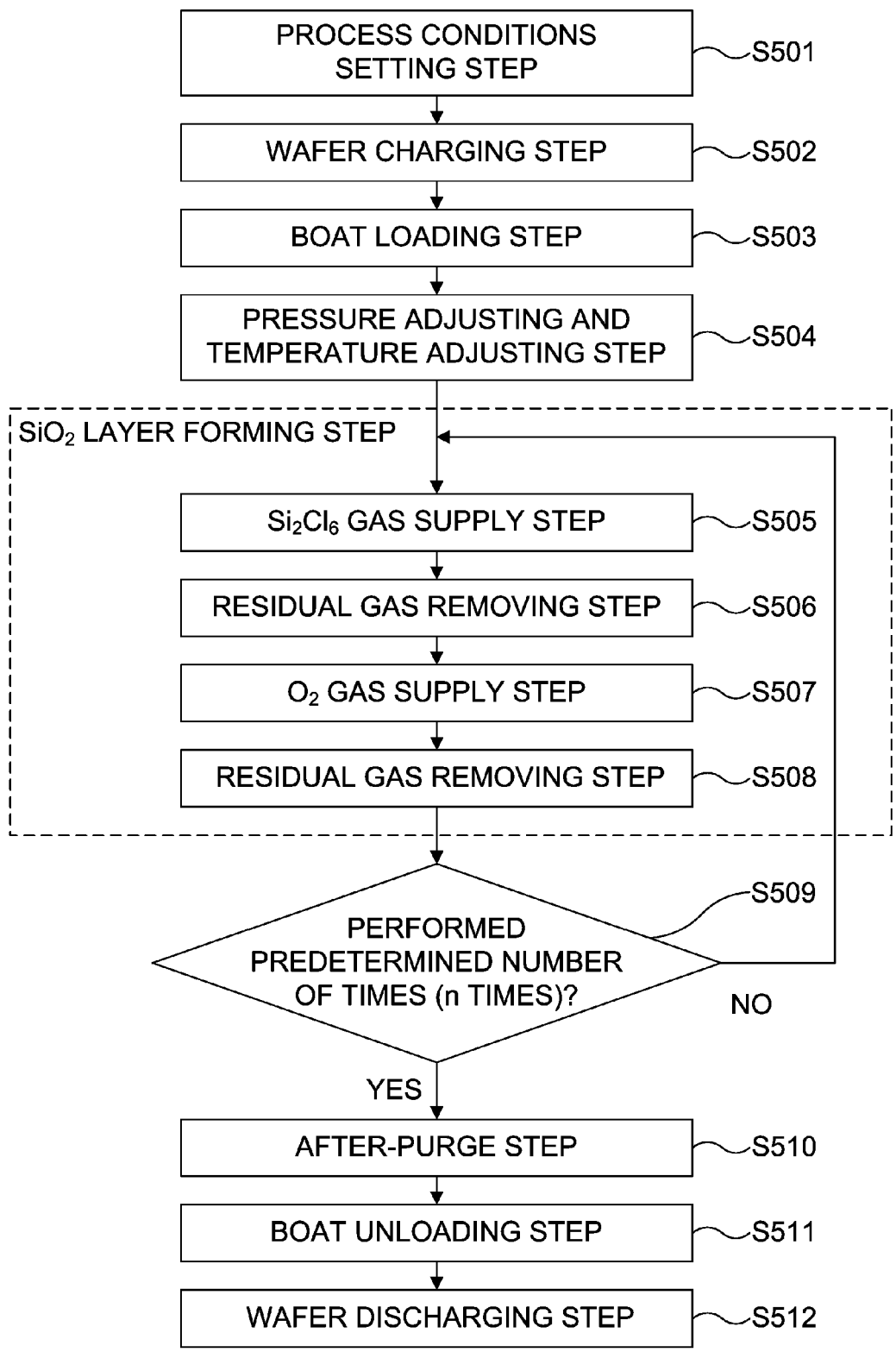
FIG. 5 is a flow chart schematically illustrating a substrate processing according to the first embodiment.

Hereinafter, as a part of the manufacturing process of the semiconductor device, an example of the film-forming process of forming an insulating film such as a silicon oxide film (also referred to as an "$SiO_2$ film") on the substrate 10 will be described with reference to FIG. 5. The film-forming process of forming the insulating film such as the $SiO_2$ film is performed by using the reaction tube. As described above, the CPU 260a of the controller 260 shown in FIG. 4 executes the program to perform the manufacturing process.

The substrate processing (that is, the method of manufacturing a semiconductor device) according to the present embodiment may include: (a) a step of supplying $Si_2Cl_6$ (disilicon hexachloride) gas through the nozzle 130 to the substrate 10 accommodated in the second reaction tube 120; (b) a step of removing a residual gas in the second reaction tube 120; (c) a step of supplying $O_2$ (oxygen) (or $O_3$ (ozone) or $H_2O$ (water)) through the nozzle 130 to the substrate 10 accommodated in the second reaction tube 120; and (d) a step of removing a residual gas in the second reaction tube 120. The steps (a) to (d) described above are performed a plurality of times to form the $SiO_2$ film on the substrate 10.

Further, while the steps (a) to (d) are performed a plurality of times, or in the steps (a) and (c) described above, the support rod 160 connected to the rotation driver 42 provided in the boat elevator 40 is rotated by the rotation driver 42. As a result, it is possible to uniformize a thickness of the film (that is, the $SiO_2$ film) formed on the substrate 10.

In the present specification, the term "substrate" may refer to "a substrate itself" or may refer to "a substrate and a stacked structure (aggregated structure) of predetermined layers or films formed on a surface of the substrate". That is, the term "substrate" may collectively refer to the substrate and the layers or the films formed on the surface of the substrate. In addition, in the present specification, the term "a surface of a substrate" may refer to "a surface (exposed surface) of a substrate itself" or may refer to "a surface of a predetermined layer or a film formed on the substrate, i.e. a top surface (uppermost surface) of the substrate as the stacked structure". In addition, in the present specification, the terms "substrate" and "wafer" may be used as substantially the same meaning.

<Process Conditions Setting Step>

Figure 6:
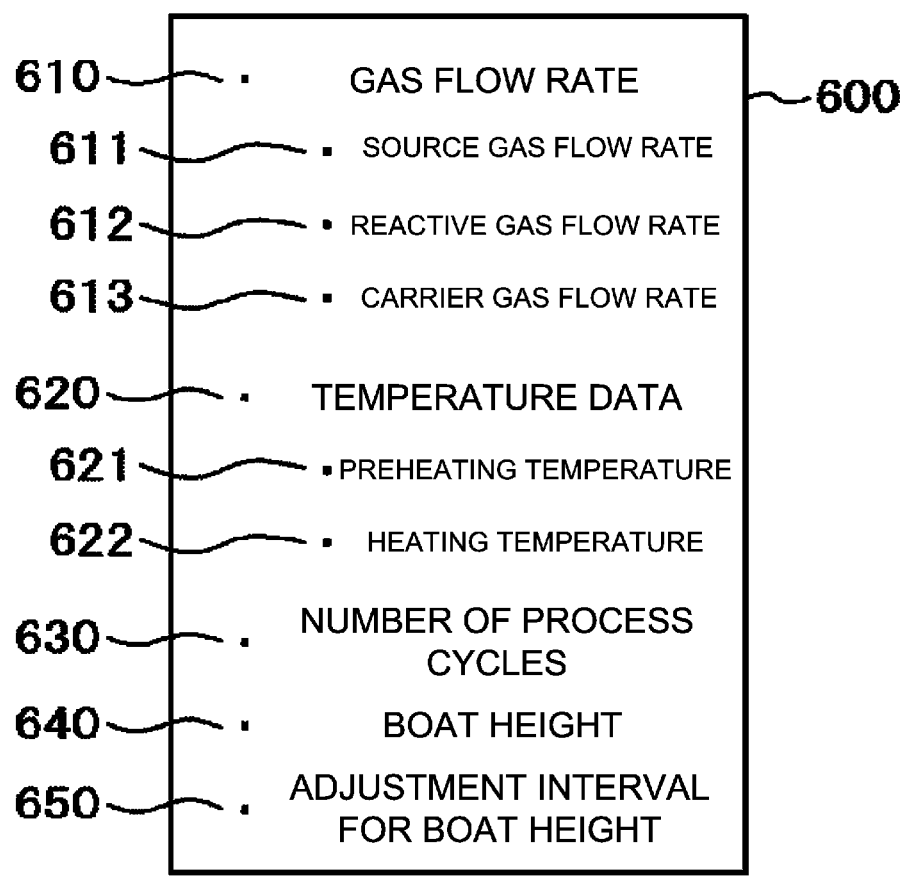
FIG. 6 is a table schematically illustrating an example of a process recipe for a film-forming process in the substrate processing apparatus according to the first embodiment.

The CPU 260a reads the process recipe and the related database stored in the memory 260c and sets the process conditions (process conditions setting step, S501). FIG. 6 is a table schematically illustrating an example of a process recipe 600 read by the CPU 260a. The process recipe 600 may include main items such as a "gas flow rate" 610, a "temperature data" 620, the "number of process cycles" 630, a "boat height" 640 and an "adjustment interval" 650 for the boat height. Further, the gas flow rate 610 may include items such as a "source gas flow rate" 611, a "reactive gas flow rate" 612 and a "carrier gas flow rate" 613. The temperature data 620 may include items such as a "preheating temperature" 621 by the heating structure 321 in the storage chamber 300 and a "heating temperature" 622 in the second reaction tube 120 by the heater 100.

Figure 7:
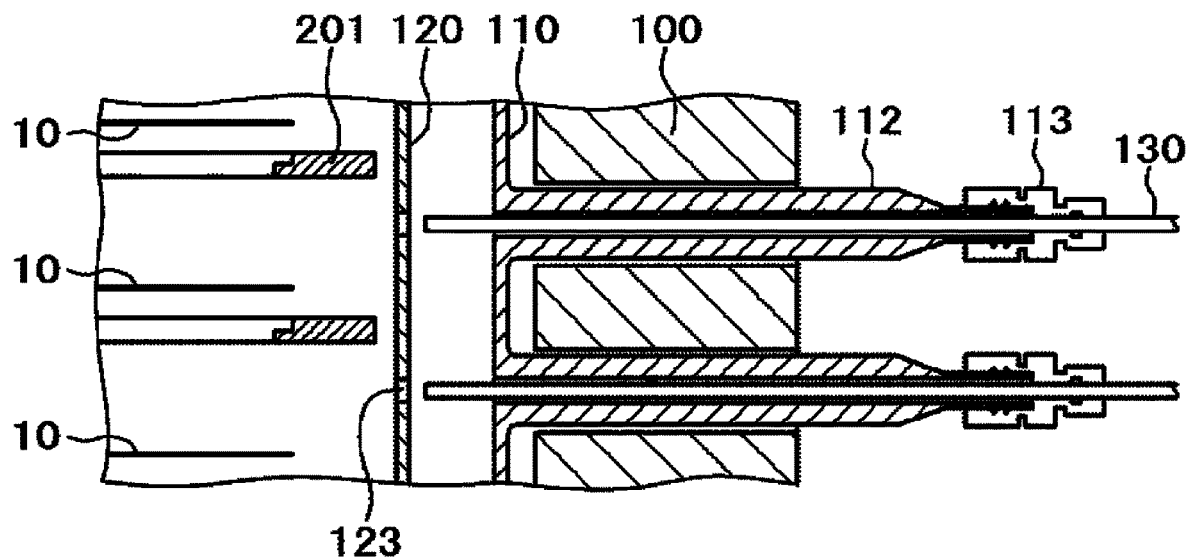
FIG. 7 is a diagram schematically illustrating a partial cross-section of a substrate accommodated in the boat and a gas supply nozzle of the substrate processing apparatus according to the first embodiment, wherein a positional relationship between the substrate and the gas supply nozzle is schematically illustrated when a gas is supplied to the substrate through the gas supply nozzle provided at a position higher than the substrate.
Figure 8:
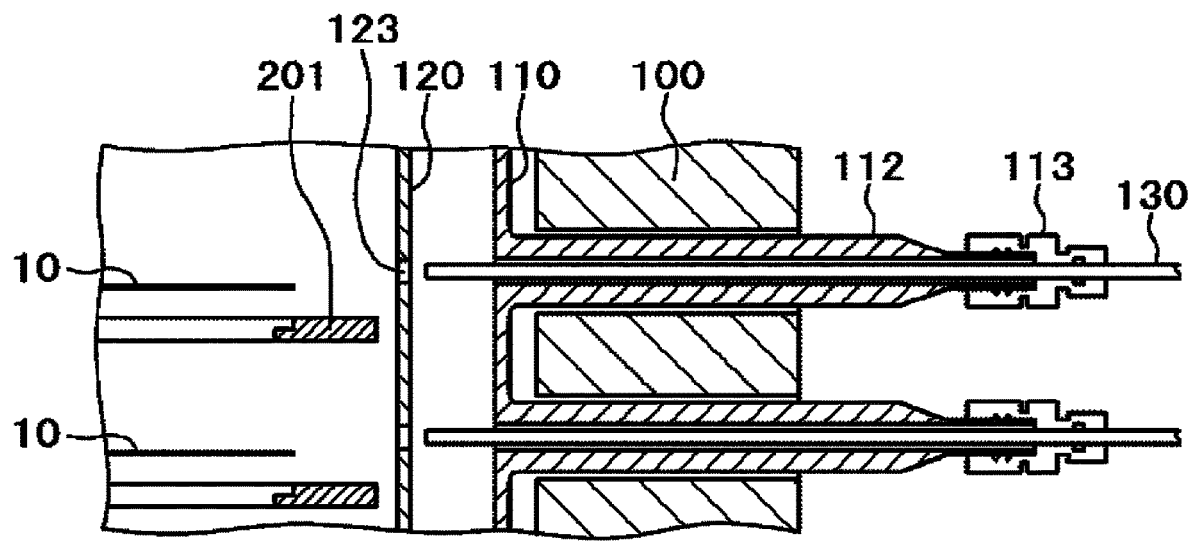
FIG. 8 is a diagram schematically illustrating a partial cross-section of the substrate accommodated in the boat and the gas supply nozzle of the substrate processing apparatus according to the first embodiment, wherein a positional relationship between the substrate and the gas supply nozzle is schematically illustrated when the gas is supplied to the substrate through the gas supply nozzle provided at substantially the same height as the substrate.

As shown in FIGS. 7 and 8, the boat height 640 in the process recipe 600 is adjusted by setting a difference between the substrate 10 accommodated in the boat 200 and an ejection position of the gas supplied into the second reaction tube 120 through the nozzle 130 via a hole 123 provided in a tube wall of the second reaction tube 120. As described above, the nozzles 130-1 through 130-5 shown in FIGS. 1 and 2A are collectively referred to as the nozzle 130 in FIGS. 7 through 9. The ejection position of the gas corresponds to a height of a front end (tip) of the nozzle 130. Specifically, since the positions of the nozzle 130 and the hole 123 provided in the tube wall of the second reaction tube 120 are fixed, the boat elevator 40 is controlled to adjust a height (height position) of the boat 200.

A vertical interval (distance or height) between the nozzle 130 and the substrate 10 is configured such that an adjustment width (for example, about ±12 mm) with respect to a reference process height can be provided.

In the present embodiment, the difference between the substrate 10 accommodated in the boat 200 and the ejection position (which corresponds to the height of the front end (tip) of the nozzle 130) of the gas supplied into the second reaction tube 120 through the nozzle 130 via the hole 123 provided in the tube wall of the second reaction tube 120 may be set as shown in FIG. 7 or FIG. 8. As indicated by a reference numeral 901 shown in FIG. 9, when the height of the front end of the nozzle 130 is higher than the surface of the substrate 10 (that is, the difference between the substrate 10 and the ejection position is set as shown in FIG. 7), a thickness distribution of the film formed on the substrate 10 is provided such that a thickness of the film formed on a central portion of the substrate 10 is thicker than that of the film formed on an outer peripheral portion of the substrate 10. That is, a convex distribution can be provided.

On the other hand, as indicated by a reference numeral 902 shown in FIG. 9, when the height of the front end of the nozzle 130 is substantially the same as the surface of the substrate 10 (that is, the difference between the substrate 10 and the ejection position is set as shown in FIG. 8), the thickness distribution of the film formed on the substrate 10 is provided such that the thickness of the film formed on the outer peripheral portion of the substrate 10 is thicker than that of the film formed on the central portion of the substrate 10. That is, a concave distribution can be provided.

On the other hand, as indicated by a reference numeral 903 shown in FIG. 9, when the heights of the front end of the nozzle 130 and the surface of the substrate 10 are set at intermediate positions between those shown in the reference numeral 901 and those shown in the reference numeral 902, or the heights of the front end of the nozzle 130 and the surface of the substrate 10 are alternately switched between the positions shown in the reference numeral 901 and the positions shown in the reference numeral 902, the thickness distribution of the film formed on the substrate 10 is obtained such that the thickness of the film formed on the outer peripheral portion of the substrate 10 is substantially the same as that of the film formed on the central portion of the substrate 10. That is, a flat distribution can be obtained.

In addition, when the height of the boat 200 is switched between that shown in FIG. 7 and that shown in FIG. 8 when the film is being formed, the adjustment interval 650 for the boat height in the process recipe 600 determines a switching time interval of the height of the boat 200.

<Substrate Loading>

With the boat 200 accommodated in the storage chamber 300, the boat elevator 40 is driven to transfer the boat 200 by pitch feeding such that new substrates including the new substrate 10 are transferred (loaded or charged) into the boat 200 one by one through the substrate loading/unloading port 331 of the transfer chamber 330 (wafer charging step, S502). Hereinafter, the new substrates including the new substrate 10 may also be simply referred to as "new substrates 10" or "substrates 10", and the new substrate 10 may also be simply referred to as the "substrate 10".

When the new substrates 10 are charged, in order to improve the temperature elevation rate of the new substrate 10 charged in the boat 200, the heating structure 321 of the storage chamber 300 operates to generate the heat, and an inside of the heating chamber 320 is heated by the infrared light through the window 310. As a result, when a lower end of the boat 200 enters the transfer chamber 330 and the new substrates 10 are being charged into the boat 200, a lower portion of the boat 200 is heated by the heating structure 321 provided at an outer peripheral portion of the heating chamber 320 such that a temperature of the boat 200 can be elevated.

When the charging of the new substrates 10 into the boat 200 is completed, the support rod 160 is driven by the boat elevator 40 to elevate the boat 200. As a result, the boat 200 is transferred (loaded) into the second reaction tube 120 from the storage chamber 300 (boat loading step, S503).

When the boat 200 is being loaded, the height of the boat 200 elevated by the boat elevator 40 is set based on the process recipe read in the step S501 such that the difference between the substrate 10 accommodated in the boat 200 and the ejection position (which corresponds to the height of the front end (tip) of the nozzle 130) of the gas supplied into the second reaction tube 120 through the nozzle 130 via the hole 123 provided in the tube wall of the second reaction tube 120 can be set as shown in FIG. 7 or FIG. 8.

In such a state, since an inner atmosphere of the storage chamber 300 and an inner atmosphere of the process chamber 115 are exhausted via the exhaust pipe 140 by the vacuum pump (not shown), the boat 200 is transferred from the storage chamber 300 into the process chamber 115 in a vacuum state. Thereby, it is possible to eliminate the time for exhausting the process chamber 115 to the vacuum state after the boat 200 is transferred from the storage chamber 300 into the process chamber 115. As a result, it is possible to shorten an entire process time.

By transferring the boat 200 from the storage chamber 300 into the process chamber 115 in the vacuum state as described above, it is possible to prevent (or suppress) the temperature of the process chamber 115 from being lowered. In addition, it is also possible to prevent (or suppress) the temperature of the substrate 10 from being lowered when the substrate 10 heated in the heating chamber 320 is being transferred from the heating chamber 320 to the process chamber 115.

After the boat 200 is loaded, the heater 100 heats the process chamber 115 such that an inner temperature of the process chamber 115 reaches and is maintained at a desired temperature. When heating the process chamber 115, since the boat 200 and the substrate 10 are already heated in the transfer chamber 330, it is possible to significantly shorten a time for elevating the inner temperature of the process chamber 115 so as to start the film-forming process (that is, an $SiO_2$ layer forming step described later) as compared with a case in which the boat 200 and the substrate 10 are loaded at a room temperature into the process chamber 115 without being heated in the transfer chamber 330. As a result, it is possible to shorten a substrate processing time, and it is also possible to improve a throughput.

<Pressure Adjusting and Temperature Adjusting Step S504>

In a state where an inner atmosphere of the second reaction tube 120 is vacuum-exhausted by the vacuum pump (not shown) to a desired pressure (vacuum degree), the heater 100 heats the second reaction tube 120 based on the recipe read in the step S501 such that an inner temperature of the second reaction tube 120 reaches and is maintained at a desired temperature. When heating the second reaction tube 120, an amount of the electric current supplied to the heater 100 is feedback-controlled based on temperature information detected by a temperature sensor (not shown) such that a desired temperature distribution of the inner temperature of the second reaction tube 120 is obtained. The heater 100 continuously heats the second reaction tube 120 until at least the processing of the substrate 10 is completed.

<$SiO_2$ Layer Forming Step>

Subsequently, a step of forming a layer such as an $SiO_2$ layer serving as a first layer (that is, the $SiO_2$ layer forming step) is performed. For example, an $Si_2Cl_6$ gas supply step S505, a residual gas removing step S506, an $O_2$ gas supply step S507 and a residual gas removing step S508 are performed as the $SiO_2$ layer forming step.

<$Si_2Cl_6$ Gas Supply Step S505>

Subsequently, a supply of the gas into the second reaction tube 120 will be described mainly based on the nozzle 130-1. However, a supply of the gas into the second reaction tube 120 through each of the nozzles 130-2 through 130-5 shown in FIGS. 1 and 2A is substantially the same as that of the gas through the nozzle 130-1.

First, by rotationally driving the rotation driver 42 provided in the boat elevator 40, the support rod 160 and the boat 200 connected to the support rod 160 are rotated. While the boat 200 is being rotated, the valve 1311-1 is opened to supply the $Si_2Cl_6$ gas serving as the source gas into the gas supply pipe 1331-1. A flow rate of the $Si_2Cl_6$ gas is adjusted by the MFC 1321-1 based on the process recipe read in the step S501. Then, the $Si_2Cl_6$ gas whose flow rate is adjusted is supplied into the second reaction tube 120 through the nozzle 130-1 and the valve 1311-1 via the hole 123 provided in a wall surface of the second reaction tube 120, and is exhausted through the exhaust pipe 140.

In the $Si_2Cl_6$ Gas Supply Step S505, relative positions (heights) of the nozzle 130-1 and the hole 123 provided in the wall surface of the second reaction tube 120 with respect to the surface of the substrate 10 accommodated in the boat 200 may be adjusted to the height set in the process recipe read in the step S501 by elevating or lowering the support rod 160 by driving the boat elevator 40, or may be switched between a plurality of positions (for example, between positions shown in FIG. 7 and the positions shown in FIG. 8) by elevating or lowering the boat 200 at a predetermined time interval based on the process recipe.

By introducing the $Si_2Cl_6$ gas into the second reaction tube 120 through the nozzle 130-1 via the hole 123 provided in the wall surface of the second reaction tube 120, the $Si_2Cl_6$ gas is supplied to the substrate 10 accommodated in the boat 200. The flow rate of the $Si_2Cl_6$ gas supplied into the second reaction tube 120 can be adjusted by each of the MFCs 1321-1 through 1321-5 in accordance with the temperature distribution in the second reaction tube 120 and the positions of the nozzles 130-1 through 130-5. Specifically, the flow rate of the $Si_2Cl_6$ gas supplied into the second reaction tube 120 may be set in a range of 0.002 slm (standard liter per minute) to 1 slm, more preferably in a range of 0.1 slm to 1 slm.

When supplying the $Si_2Cl_6$ gas, simultaneously, the valve 1313-1 is opened to supply the carrier gas (inert gas) such as $N_2$ (nitrogen) gas and Ar (argon) gas into the gas supply pipe 1333-1. When the $N_2$ gas is used as the carrier gas, a flow rate of the $N_2$ gas supplied into the gas supply pipe 1333-1 is adjusted by the MFC 1323-1. Then, the $N_2$ gas whose flow rate is adjusted is supplied into the second reaction tube 120 together with the $Si_2Cl_6$ gas, and is exhausted through the exhaust pipe 140. Specifically, the flow rate of the carrier gas may be set in a range of 0.01 slm to 5 slm, more preferably in a range of 0.5 slm to 5 slm.

The carrier gas such as the $N_2$ gas is supplied into the second reaction tube 120 through the nozzle 130-1, and is exhausted through the exhaust pipe 140. When the $N_2$ gas is supplied and exhausted, a temperature of the heater 100 is set such that the temperature of the substrate 10 is in a range of, for example, 250° C. to 550° C.

In the $Si_2Cl_6$ Gas Supply Step S505, the $Si_2Cl_6$ gas and the carrier gas such as the $N_2$ gas are supplied into the second reaction tube 120 without any other gas being supplied into the second reaction tube 120 together with the $Si_2Cl_6$ gas and the carrier gas. By supplying the $Si_2Cl_6$ gas into the second reaction tube 120, a silicon-containing layer whose thickness is, for example, within a range of less than a single atomic layer to several atomic layers is formed on the substrate 10 (that is, on a base film on the surface of the substrate 10).

<Residual Gas Removing Step S506>

After the silicon-containing layer is formed on the surface of the substrate 10 by supplying the $Si_2Cl_6$ gas serving as the source gas into the second reaction tube 120 through the nozzle 130-1 for a predetermined time, the valve 1311-1 is closed to stop the supply of the $Si_2Cl_6$ gas. In the residual gas removing step S506, the vacuum pump (not shown) vacuum-exhausts the inner atmosphere of the second reaction tube 120 to remove a residual gas in the second reaction tube 120 such as the $Si_2Cl_6$ gas which did not react or which contributed to the formation of the silicon-containing layer out of the second reaction tube 120.

In the residual gas removing step S506, with the valve 1313-1 open, the carrier gas such as the $N_2$ gas is continuously supplied into the second reaction tube 120. The $N_2$ gas serves as a purge gas, which improves the efficiency of removing the residual gas in the second reaction tube 120 such as the $Si_2Cl_6$ gas which did not react or which contributed to the formation of the silicon-containing layer out of the second reaction tube 120.

<$O_2$ Gas Supply Step S507>

After the residual gas in the second reaction tube 120 is removed from the second reaction tube 120, while the boat 200 is being rotated, the valve 1312-1 for supplying an O₂ gas is opened to supply the O₂ gas serving as the reactive gas into the gas supply pipe 1332-1 for supplying the 02 gas. A flow rate of the O₂ gas is adjusted by the MFC 1322-1 for supplying the O₂ gas. Then, the O₂ gas whose flow rate is adjusted is supplied into the second reaction tube 120 through the nozzle 130-1 and the valve 1312-1 via the hole 123 provided in the wall surface of the second reaction tube 120, and is exhausted through the exhaust pipe 140. Thereby, the O₂ gas is supplied to the substrate 10. Specifically, the flow rate of the O₂ gas may be set in a range of 0.002 slm to 1 slm, more preferably in a range of 0.1 slm to 1 slm.

When supplying the O₂ gas, the valve 1313-1 for supplying the N₂ gas (that is, the carrier gas) is closed in order to prevent the N₂ gas from being supplied into the second reaction tube 120 together with the O₂ gas. That is, the O₂ gas is supplied into the second reaction tube 120 without being diluted with the N₂ gas. As a result, it is possible to improve a film-forming rate of the SiO₂ layer. In addition, it is also possible to adjust an atmospheric concentration of the N₂ gas in the vicinity of the substrate 10. In the O₂ gas supply step S507, the temperature of the heater 100 is set to substantially the same temperature as that of the Si₂Cl₆ gas supply step S505.

In the O₂ gas supply step S507, the O₂ gas is supplied into the second reaction tube 120 without any other gas being supplied into the second reaction tube 120 together with the O₂ gas. A substitution reaction occurs between the O₂ gas and at least a portion of the silicon-containing layer formed on the substrate 10 in the Si₂Cl₆ gas supply step S505. During the substitution reaction, silicon (Si) contained in the silicon-containing layer and oxygen (O) contained in the O₂ gas are bonded. As a result, the SiO₂ layer containing silicon and oxygen is formed on the substrate 10.

<Residual Gas Removing Step S508>

After the SiO₂ layer is formed, the valve 1312-1 for supplying the O₂ gas is closed to stop the supply of the O₂ gas. Then, a residual gas in the second reaction tube 120 such as the O₂ gas which did not react or which contributed to the formation of the SiO₂ layer and reaction by-products are removed out of the second reaction tube 120 in the same manners as in the residual gas removing step S506.

<Performing a Predetermined Number of Times: S509>

By performing a cycle wherein the step S505 through the step S508 described above are sequentially performed in this order at least once (that is, a predetermined number of times or n times), the SiO₂ film of a predetermined thickness (for example, 0.1 nm to 2 nm) is formed on the substrate 10. It is preferable that the cycle described above is repeatedly performed a plurality of times, for example, preferably about 10 times to 80 times, and more preferably about 10 times to 15 times.

In addition, the height of the nozzle 130 with respect to the substrate 10 may be changed for each cycle, every few cycles, or between a first half and a second half of the total number of the cycles.

On the other hand, when a time of a single cycle is relatively long, the height of the nozzle 130 with respect to the substrate 10 may be changed in the single cycle.

As described above, by forming the film such as the SiO₂ film when a relative height relationship among a front end (tip) of the nozzle 130-1, the hole 123 provided in the wall surface of the second reaction tube 120 and the surface of the substrate 10 accommodated in the boat 200 is set based on the process recipe read in the step S501, it is possible to form the film with a uniform thickness distribution on the surface of the substrate 10.

In addition, while the present embodiment is described by way of an example in which the boat 200 accommodating the substrates 10 is rotated by the rotation driver 42 in the Si₂Cl₆ gas supply step S505 and the O₂ gas supply step S507, the boat 200 may be continuously rotated by the rotation driver 42 during the residual gas removing step S506 and the residual gas removing step S508.

<After-Purge Step and Boat Unloading Step>

The carrier gas such as the N₂ gas is supplied into the second reaction tube 120 through the nozzle 130-1 by opening the valve 1313-1 for supplying the carrier gas, and is exhausted through the exhaust pipe 140. The N₂ gas serves as the purge gas, and the inner atmosphere of the second reaction tube 120 is purged with the N₂ gas serving as the inert gas. Thereby, the residual gas in the second reaction tube 120 or the by-products remaining in the second reaction tube 120 are removed from the second reaction tube 120 (after-purge step S510).

Thereafter, the boat elevator 40 is driven to lower the support rod 160, and the boat 200 accommodating the substrate 10 on which the film of a predetermined thickness is formed on the surface thereof is transferred (unloaded) to the storage chamber 300 (boat unloading step S511).

When the boat 200 accommodating the substrate 10 on which the film is formed on the surface thereof is transferred (unloaded) to the chamber 180, according to the present embodiment, the substrate 10 with the film formed on the surface thereof is transferred (discharged) from the boat 200 through the substrate loading/unloading port 331 of the transfer chamber 330 (wafer discharging step S512). Thereby, the processing of the substrate 10 is completed.

For example, when processing a next set of substrates 10 (that is, new substrates 10) in the same manner, the boat elevator 40 is driven to transfer the boat 200 by pitch feeding such that the substrate 10 with the film formed on the surface thereof is transferred out of the boat 200 and a substrate (that is, a new substrate 10) among the new substrates 10 is transferred into the boat 200 one by one alternately (wafer charging step S502).

An order of replacing the substrates 10 may be changed, such as from top to bottom, from bottom to top, and from a middle portion of the boat 200. However, when the substrates 10 are replaced from the bottom of the boat 200, it is possible to shorten a temperature elevation time of the substrate 10. However, since temperatures of an uppermost substrate and a lowermost substrate among the substrates 10 accommodated in the boat 200 tend to be higher than those of the substrates 10 accommodated in the middle portion of the boat 200, the replacement of the substrates 10 may be started in order from the middle portion of the boat 200.

In addition, while the present embodiment is described by way of an example in which the boat elevator 40 is driven to transfer the boat 200 by pitch feeding such that the substrate 10 with the film formed on the surface thereof is transferred out of the boat 200 and the new substrate 10 is transferred into the boat 200 one by one alternately, the present embodiment is not limited thereto. For example, substrates among the substrates 10 may be simultaneously transferred out of the boat 200 and substrates among the new substrates 10 may be simultaneously transferred into the boat 200. In such a case, the boat elevator 40 is driven to transfer the boat 200 by pitch feeding such that the boat 200 is transferred by the number of the substrates among the substrates 10 (or the number of the substrates among the new substrates 10).

Further, the substrates among the substrates 10 may be simultaneously transferred out of the boat 200, and the substrates among the new substrates 10 may be simultaneously transferred into the boat 200 such that an entirety of the new substrates (that is, unprocessed substrates) 10 accommodated in the boat 200 are heated at once.

Further, when the boat 200 is lowered by the boat elevator 40 and the substrate 10 with the film formed on the surface thereof accommodated in the boat 200 is replaced with the new substrate 10, the heater 100 of the substrate processing apparatus 101 may continuously heats the boat 200. Thereby, it is possible to prevent a temperature of an upper portion of the boat 200 from being lowered. Since a heating time of a substrate on the upper portion of the boat 200 in the heating chamber 320 after the new substrate 10 is transferred can be shortened, it is possible to eliminate, to some extent, a temperature difference between a substrate among the new substrates 10 on the upper portion of the boat 200 and a substrate among the new substrates 10 on a lower portion of the boat 200.

While the present embodiment is described by way of an example in which the $SiO_2$ film is formed on the substrate 10, the present embodiment is not limited thereto. For example, instead of the $SiO_2$ film, the present embodiment may also be applied when a silicon nitride film such as an $Si_3N_4$ film or a titanium nitride film such as a TiN film is formed.

According to the present embodiment, it is possible to form a film of a desired thickness distribution on the substrate 10 accommodated in the boat 200.

First Modified Example

Figure 10:
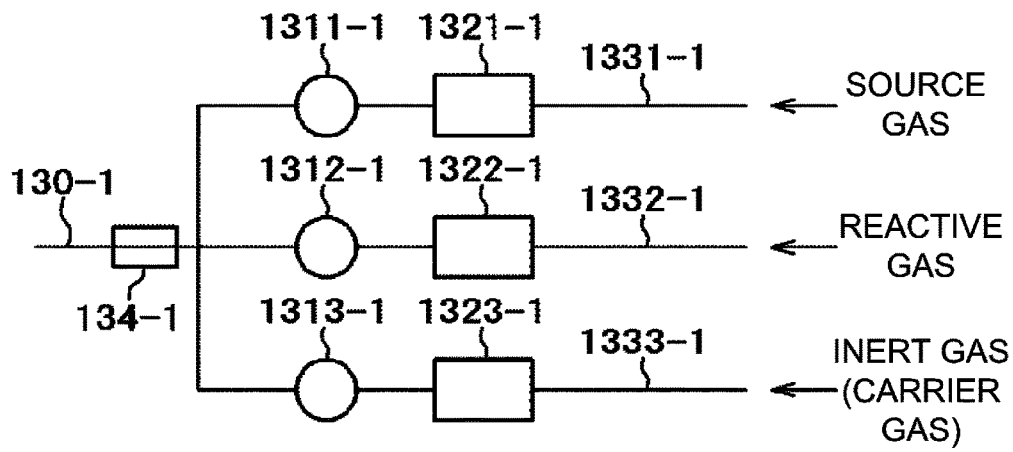
FIG. 10 is a block diagram schematically illustrating a detailed configuration of a gas supplier of the substrate processing apparatus according to a modified example of the first embodiment.

A first modified example of the first embodiment is illustrated in FIG. 10. According to the present modified example, a heater 134-1 is provided in the nozzle 130-1 such that the temperature of the source gas or the reactive gas supplied into the second reaction tube 120 can be adjusted. Similarly, the heater 134 is provided in the nozzles 130-2 through 130-5. As a result, the temperature of the source gas or the reactive gas supplied into the second reaction tube 120 can be individually adjusted according to the positions of the nozzles 130-1 through 130-5.

With such a configuration, it is possible to control (or adjust) the preheating temperature of the source gas or the reactive gas supplied into the second reaction tube 120 through the nozzles 130-1 through 130-5 based on a pre-set temperature (control temperature) for each zone of the heater 100. Specifically, for example, the preheating temperature by the heater 134-1 is set within a range of 160° C. and 250° C.

Specifically, when the temperature of the heater 100 detected by a temperature detector (not shown) is higher than the pre-set temperature, the heating temperature by the heater 134-1 is lowered. On the other hand, when the temperature of the heater 100 detected by the temperature detector (not shown) is lower than the pre-set temperature, the heating temperature by the heater 134-1 is elevated.

As a result, it is possible to suppress variations in a degree of decomposition of the source gas due to a temperature distribution for each zone of the heater 100, and it is also possible to more uniformize the thickness of the film formed on the surface of the substrate 10.

Second Modified Example

According to a second modified example of the first embodiment, as a method of uniformizing between the substrates 10 a decomposition state of the process gas such as the source gas ejected through the nozzle 130 onto the surface of the substrate 10 by controlling a concentration of the source gas by the carrier gas according to the temperature distribution of each zone of the heater 100, one of the following control methods may be performed.

a) A control method of adjusting a flow rate of the process gas while maintaining the flow rate of the carrier gas constant.

When the inner temperature of the second reaction tube 120 is high, the flow rate of the process gas is adjusted (or set) to be smaller than a reference flow rate. On the other hand, when the inner temperature of the second reaction tube 120 is low, the flow rate of the process gas is adjusted (or set) to be greater than the reference flow rate.

b) A control method of adjusting the flow rate of the carrier gas while maintaining the flow rate of the process gas constant.

When the inner temperature of the second reaction tube 120 is high, the flow rate of the carrier gas is adjusted (or set) to be greater than the reference flow rate. On the other hand, when the inner temperature of the second reaction tube 120 is low, the flow rate of the carrier gas is adjusted (or set) to be smaller than the reference flow rate.

c) When the temperature of the nozzle 130 is high, both of the flow rate of the process gas and the flow rate of the carrier gas are adjusted (or set) to be smaller than the reference flow rate. When the temperature of the nozzle 130 is low, both of the flow rate of the process gas and the flow rate of the carrier gas are adjusted (or set) to be greater than the reference flow rate.

As a result, it is possible to suppress variations in the degree of the decomposition of the source gas due to the temperature distribution for each zone of the heater 100, and it is also possible to more uniformize the thickness of the film formed on the surface of the substrate 10.

Second Embodiment

Figure 11:
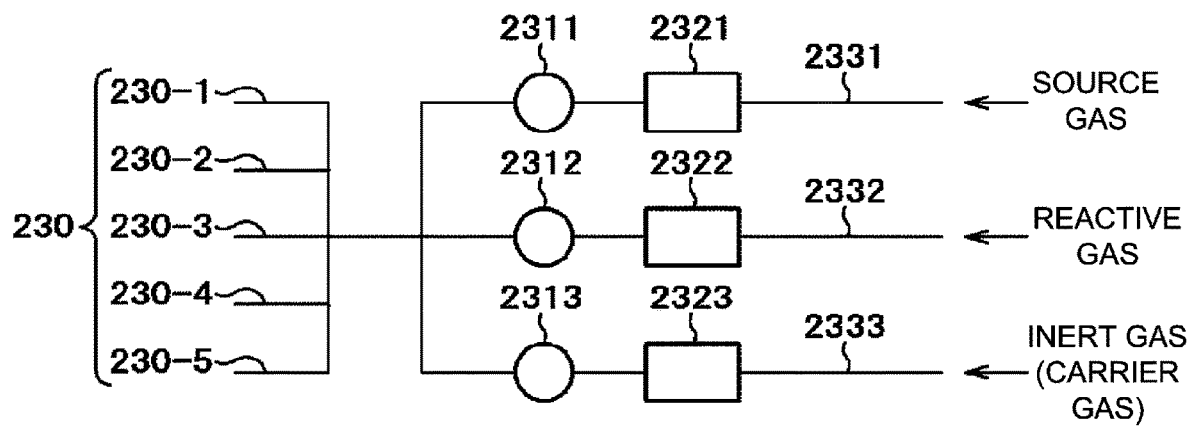
FIG. 11 is a block diagram schematically illustrating a detailed configuration of a gas supplier of the substrate processing apparatus according to a second embodiment of the present disclosure.

In the first embodiment, the nozzles 130-1 through 130-5 are provided with the valves 1311-1 through 1313 and the MFCs 1321 through 1323, respectively. However, according to the second embodiment, as shown in FIG. 11, the valve and the MFC are commonly used for each gas type, and nozzles 230-1, 230-2, 230-3, 230-4 and 230-5 constituting a nozzle 230 are branched off such that each gas can be supplied into the second reaction tube 120 through the nozzles 230-1 through 230-5.

That is, according to the present embodiment, the flow rate of the source gas supplied through a gas supply pipe 2331 is controlled (adjusted) by an MFC 2321, a supply of the source gas is controlled by a valve 2311 by opening or closing the valve 2311, and then the source gas is supplied into the second reaction tube 120 through each of the branched nozzles 230-1 through 230-5.

In addition, the flow rate of the reactive gas supplied through a gas supply pipe 2332 is controlled (adjusted) by an MFC 2322, a supply of the reactive gas is controlled by a valve 2312 by opening or closing the valve 2312, and then the reactive gas is supplied into the second reaction tube 120 through each of the branched nozzles 230-1 through 230-5.

In addition, the flow rate of the carrier gas supplied through a gas supply pipe 2333 is controlled (adjusted) by an MFC 2323, a supply of the carrier gas is controlled by a valve 2313 by opening or closing the valve 2313, and then the carrier gas is supplied into the second reaction tube 120 through each of the branched nozzles 230-1 through 230-5.

According to the present embodiment, for example, the steps such as the step of forming the $SiO_2$ layer on the substrate 10 are substantially the same as those of the first embodiment described with reference to FIG. 5, and thus the descriptions thereof will be omitted.

According to the present embodiment, since the valve and the MFC are shared for each gas type, it is possible to simplify a configuration of the gas supplier (which is a gas supply system), and it is also possible to simplify an entire configuration of the substrate processing system 1 as compared with the first embodiment.

Figure 12:
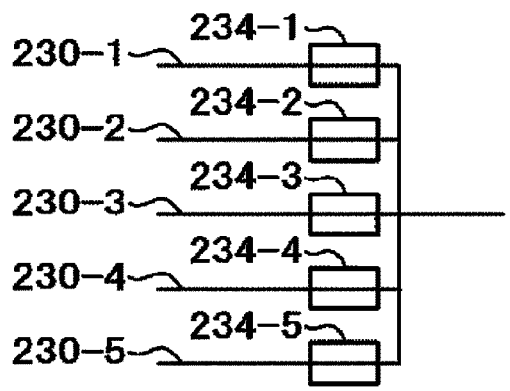
FIG. 12 is a block diagram schematically illustrating an exemplary configuration of a gas supplier of the substrate processing apparatus according to a modified example of the second embodiment.

Further, in the present embodiment, as shown in FIG. 12, heaters 234-1 through 234-5 are provided at the nozzles 230-1 through 230-5, respectively, as in the first modified example of the first embodiment. As a result, according to the present embodiment, the temperature of the source gas or the reactive gas supplied into the second reaction tube 120 can be individually adjusted according to positions of the nozzles 230-1 through 230-5.

With such a configuration, it is possible to control (or adjust) the temperature of the source gas or the reactive gas supplied into the second reaction tube 120 through the nozzles 230-1 through 230-5 based on the pre-set temperature for each zone of the heater 100. As a result, it is possible to suppress the variations in the degree of the decomposition of the source gas due to the temperature distribution for each zone of the heater 100, and it is also possible to more uniformize the thickness of the film formed on the surface of the substrate 10.

Third Embodiment

In the first embodiment and the second embodiment, the nozzles 130-1 through 130-5 or the nozzles 230-1 through 230-5 through which the source gas, the reactive gas and the carrier gas are supplied into the second reaction tube 120 are shared. However, according to the third embodiment, as shown in FIG. 13, nozzles 430-1, 430-2, 430-3, 430-4 and 430-5 constituting a nozzle 430 through which the source gas and the reactive gas are supplied into the second reaction tube 120 are shared while the carrier gas is supplied into the second reaction tube 120 through a nozzle 440 different from the nozzles 430-1 through 430-5.

Figure 13:
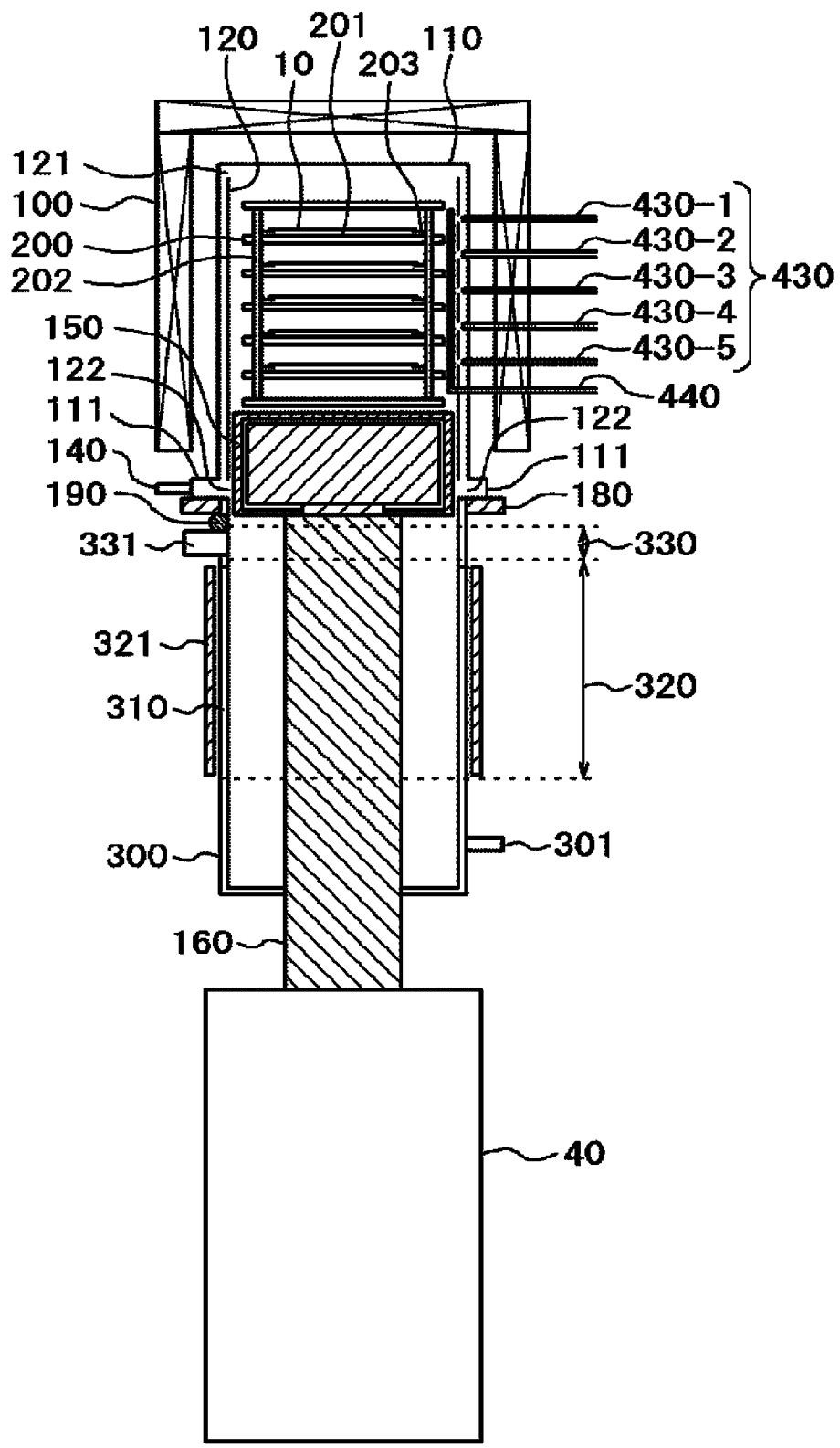
FIG. 13 is a diagram schematically illustrating a cross-section of the process chamber and the boat storage chamber when the boat accommodating the plurality of substrates is transferred into the process chamber of the substrate processing apparatus according to a third embodiment of the present disclosure, wherein an exemplary configuration of a gas supplier of the substrate processing apparatus according to a third embodiment is schematically illustrated.

That is, according to the present embodiment, as shown in FIG. 13, the source gas and the reactive gas are supplied into the second reaction tube 120 through the nozzles 430-1 through 430-5 which constitute the nozzle 430 and are arranged in the vertical direction at the same interval as the vertical interval (pitch) between adjacent substrates among the substrates 10 accommodated in the boat 200. The nozzles 430-1 through 430-5 penetrate through the heater 100 and extend in the horizontal direction. On the other hand, the carrier gas is supplied into the second reaction tube 120 from through the nozzle 440 extending in the vertical direction in the second reaction tube 120. The nozzle 430 may be configured to extend in a direction parallel to the substrate 10.

According to the present embodiment, since configurations of the nozzles 430-1 through 430-5 constituting the nozzle 430 are substantially the same, an exemplary configuration of the nozzle 430-1 will be described with reference to FIG. 14, and descriptions of the nozzles 430-2, 430-3, 430-4 and 430-5 are omitted. The source gas and the reactive gas are introduced into the second reaction tube 120 through the nozzle 430-1. The vertical interval between adjacent nozzles among the nozzles 430-1 through 430-5 is set to be the same as the vertical interval between adjacent substrates among the substrates 10 accommodated in the boat 200.

Figure 14:
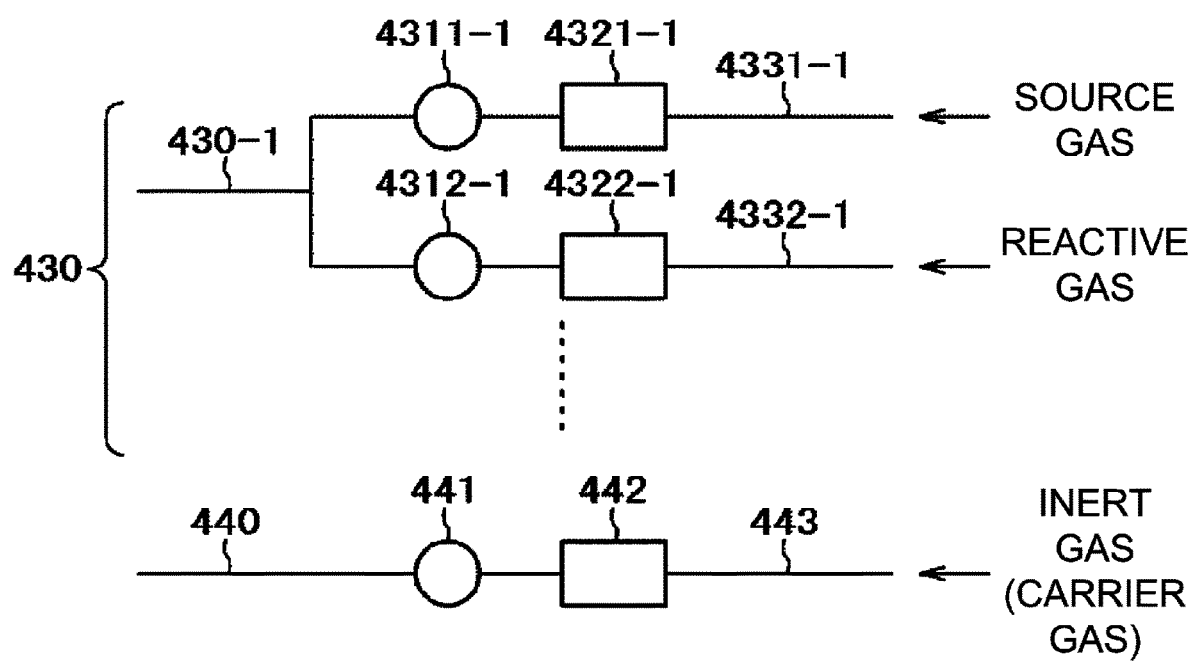
FIG. 14 is a block diagram schematically illustrating a detailed configuration of the gas supplier of the substrate processing apparatus according to the third embodiment.

As shown in FIG. 14, the flow rate of the source gas supplied into a gas supply pipe 4331-1 from the source gas supply source (not shown) is adjusted by a mass flow controller (MFC) 4321-1. Then, the source gas whose flow rate is adjusted is supplied into the second reaction tube 120 through the nozzle 430-1 via a valve 4311-1.

The flow rate of the reactive gas supplied into a gas supply pipe 4332-1 from the reactive gas supply source (not shown) is adjusted by a mass flow controller (MFC) 4322-1. Then, the reactive gas whose flow rate is adjusted is supplied into the second reaction tube 120 through the nozzle 430-1 via a valve 4312-1.

The configurations of the nozzles 430-2 through 430-5 constituting the nozzle 430 are substantially the same as that of the nozzle 430-1, and the source gas and the reactive gas are likewise supplied into the second reaction tube 120 through the nozzles 430-2 through 430-5.

On the other hand, the flow rate of the inert gas (carrier gas) supplied into a gas supply pipe 433 from the inert gas supply source (not shown) is adjusted by a mass flow controller (MFC) 442. Then, the inert gas whose flow rate is adjusted is supplied into the second reaction tube 120 through the nozzle 440 via a valve 441. The nozzle 430 extends in the vertical direction in the second reaction tube 120. The nozzle 440 is provided with a plurality of holes at a plurality of locations along a portion of the nozzle 430 extending in the vertical direction in the second reaction tube 120, and the inert gas is supplied into the second reaction tube 120 through the plurality of holes.

According to the present embodiment, for example, the steps such as the step of forming the $SiO_2$ layer on the substrate 10 are substantially the same as those of the first embodiment described with reference to FIG. 5, and thus the descriptions thereof will be omitted.

As described above, according to the technique of the present disclosure, both of a film-forming method (in which the positional relationship between the substrate and the nozzle is variable or fixed to an optimum value according to the surface area of the substrate or the type of the film to be formed) and a film-forming method (in which the positions of the substrate and the holes such as ejection holes for the film-forming gas are changed in time in accordance with a change in the gas type supplied through the nozzle or a change in the flow rate thereof in a series of film-forming sequences) can be used.

Further, according to the technique of the present disclosure, the nozzle can be applied in both cases, that is, a case in which the nozzle is branched into a plurality of nozzles with respect to a single gas flow rate controller to eject and supply the gas of the same flow rate to each substrate and a case in which the flow rate controller is individually provided for each hole. When the flow rate controller is individually provided for each hole, it is possible to eject the film-forming gas with different flow rate to each substrate by considering the positional relationship (for example, height and distance) between the substrate and the each hole and also the decomposition of the gas due to the temperature in the reaction chamber.

Further, according to the technique of the present disclosure, the nozzle is fixed to the reaction chamber, and the substrate retainer (boat) in which the substrates are accommodated (or supported) in a multistage manner is configured to move up and down by the elevator. When it is preferable to partition the reaction chamber where the film-forming process is performed and a loading region located below the reaction chamber for shutting off the gas or shutting off the pressure, the reaction chamber and the loading region are partitioned by an O-ring seal and sealed with a telescopic seal structure (bellow) corresponding to a stroke of a vertical movement (for a variable nozzle position relationship) of the substrate retainer. On the other hand, when a pressure of the loading region is the same as that of the reaction chamber, the O-ring seal may not be provided. That is, the reaction chamber and the vacuum loading region (loading region) are in communication with each other. In such a case, the inert gas is supplied through the vacuum loading region and a pressure gradient is applied to shut off the gas.

Further, according to the technique of the present disclosure, it is possible to eject the film-forming gas through the nozzle to supply the gas to the substrate while adjusting the position of the nozzle in accordance with its distance from the surface of the substrate and changing a flow velocity of the gas on a surface layer of the substrate, and it is also possible to adjust the decomposition state of the film-forming gas (in which a gas phase reaction easily occurs) until it reaches the surface layer and contributes to forming the film. In addition, when the flow controller is provided individually for each hole, it is possible to finely adjust the flow rate of the gas for each substrate. Therefore, it is possible to omit a film-forming tuning such as an optimization by replacing the conventional hardware such as a quartz nozzle).

According to the technique of the present disclosure, in a method of manufacturing a semiconductor device of forming the film on the plurality of substrates by performing: (a) accommodating the substrate retainer in which the plurality of substrates are overlappingly stacked at vertical intervals into the reaction tube by driving the substrate retainer by the vertical driver; (b) heating the plurality of substrates supported in the substrate retainer accommodated in the reaction tube by the heater provided around the reaction tube to surround the reaction tube; and (c) performing (c-1) supplying the source gas to the plurality of substrates supported in the substrate retainer accommodated in the reaction tube through the plurality of nozzles of the gas supplier and exhausting the source gas out of the reaction tube and (c-2) supplying the reactive gas to the plurality of substrates supported in the substrate retainer accommodated in the reaction tube through the plurality of nozzles of the gas supplier and exhausting the reactive gas out of the reaction tube one or more times, wherein the supply of the source gas and the reactive gas through the plurality of nozzles of the gas supplier are performed while adjusting the height of the substrate retainer accommodated in the reaction tube by the vertical driver and adjusting (controlling) the interval (height) between the substrate among the plurality of substrates supported in the substrate retainer and the nozzle among the plurality of nozzles in accordance with the pre-set conditions.

Further, according to the technique of the present disclosure, the source gas and the reactive gas are supplied through the plurality of nozzles arranged at the same interval as the vertical interval of the plurality of substrates accommodated in the substrate retainer.

Further, according to the technique of the present disclosure, the source gas, the reactive gas and the carrier gas can be supplied to the plurality of substrates accommodated in the substrate retainer through the plurality of nozzles in a state where the flow rate of each of the source gas, the reactive gas and the carrier gas is adjusted using the mass flow controller serving as a flow rate controller corresponding to each gas for each nozzle.

Further, according to the technique of the present disclosure, the source gas, the reactive gas and the carrier gas can be supplied to the plurality of substrates accommodated in the substrate retainer through the plurality of nozzles in a state where the flow rate of each of the source gas, the reactive gas and the carrier gas is adjusted using the mass flow controller serving as a flow rate controller common for each gas.

Further, according to the technique of the present disclosure, the step of supplying the source gas through the plurality of nozzles of the gas supplier and the step of supplying the reactive gas through the plurality of nozzles of the gas supplier are performed one or more times after adjusting the height of the substrate retainer accommodated in the reaction tube by the vertical driver and adjusting the interval (height) between the substrate among the plurality of substrates supported in the substrate retainer and the nozzle among the plurality of nozzles.

Other Embodiments

While the technique of the present disclosure is described in detail by way of the above-described embodiments, the technique of the present disclosure is not limited thereto. The technique of the present disclosure may be modified in various ways without departing from the scope thereof.

For example, the embodiments are described by way an example in which the nozzle 130 or the nozzle 430 extends in the direction parallel to the substrate 10 (that is, the horizontal direction). However, the technique of the present disclosure is not limited thereto. For example, the nozzle through which the process gas is supplied may be configured as a structure of the nozzle 440. By adjusting the positional relationship (height relationship) between the holes provided in the nozzle 440 and the substrate 10, the same effects described above may be obtained similarly. When the nozzle through which the process gas is supplied is configured as the structure of the nozzle 440, it may be difficult to adjust the decomposition state of the process gas supplied to each of the substrates 10. Therefore, in order to adjust the decomposition state of the process gas supplied to each of the substrates 10, the nozzle 130 and the nozzle 430 are configured to extend in the direction parallel to the substrate 10 as described above.

For example, the embodiments are described by way of an example in which the film-forming process is performed. However, the technique of the present disclosure is not limited thereto. The technique of the present disclosure may also be applied to other processes. For example, the technique of the present disclosure may also be applied to a process such as a diffusion process using a plasma, an oxidation process, a nitridation process, an oxynitridation process, a reduction process, an oxidation-reduction process, an etching process and a heating process. For example, the technique of the present disclosure may also be applied to a process such as a plasma oxidation process or a plasma nitridation process of a film formed on the substrate or the surface of the substrate using the reactive gas alone. The technique of the present disclosure may also be applied to a plasma annealing process using the reactive gas alone.

For example, the embodiments are described by way of an example in which the manufacturing process of the semiconductor device is performed. However, the technique of the present disclosure is not limited thereto. For example, the technique of the present disclosure may be applied to other manufacturing processes. For example, the technique of the present disclosure may be applied to a substrate processing such as a manufacturing process of a liquid crystal device, a manufacturing process of a solar cell, a manufacturing process of a light emitting device, a processing of a glass substrate, a processing of a ceramic substrate and a processing of a conductive substrate.

For example, the embodiments are described by way of an example in which the silicon oxide film is formed using a silicon-containing gas as the source gas and an oxygen-containing gas as the reactive gas. However, the technique of the present disclosure is not limited thereto. The technique of the present disclosure may be applied to the formations of other films using different gases. For example, a technique of the present disclosure may also be applied to formations of a nitride film, an oxygen-containing film, a nitrogen-containing film, a carbon-containing film, a boron-containing film, a metal-containing film and combinations thereof. For example, the technique of the present disclosure may also be applied to formations of a silicon nitride (SiN) film, an aluminum oxide (AlO) film, a zirconium oxide (ZrO) film, a hafnium oxide (HfO) film, a hafnium aluminum oxide (HfAlO) film, a zirconium aluminum oxide (ZrAlO) film, a silicon carbide (SiC) film, a silicon carbonitride (SiCN) film, a silicon boronitride (SiBN) film, a titanium nitride (TiN) film, a titanium carbide (TiC) film and a titanium aluminum carbide (TiAlC) film.

According to some embodiments of the present disclosure, it is possible to improve the thickness uniformity of the film formed on each of the plurality of substrates when the plurality of substrates are processed simultaneously.

What is claimed is:

1. A substrate processing apparatus comprising:
    a substrate retainer configured to support a substrate;
    a reaction vessel in which the substrate retainer supporting the substrate is accommodated;
    a vertical driver configured to move the substrate retainer into the reaction vessel or out of the reaction vessel;
    a heater provided around the reaction vessel and configured to heat the substrate;
    a gas supplier provided with a gas feeder corresponding to the substrate supported by the substrate retainer accommodated in the reaction vessel, wherein the gas feeder penetrates, from beside the heater, a side wall of the heater and a side wall of the reaction vessel, extends in a direction parallel to a surface of the substrate and is configured to be capable of supplying a gas to above the substrate;
    an exhauster through which the gas supplied through the gas supplier is exhausted from the reaction vessel; and
    a controller configured to control at least the vertical driver and the gas supplier such that:
    (i) the gas is supplied through the gas feeder while a relative height of a surface of the substrate with respect to a front end of the gas feeder is maintained at a first position where a first film thickness distribution is obtained as a substrate processing state; and
    (ii) the gas is supplied through the gas feeder while the relative height of the surface of the substrate with respect to the front end of the gas feeder corresponding to the substrate is maintained at a second position which is different from the first position and where a second film thickness distribution different from the first film thickness distribution is obtained as the substrate processing state.

2. The substrate processing apparatus of claim 1, wherein the controller is further configured to be capable of controlling the vertical driver when the substrate is processed by supplying a process gas to the substrate through the gas supplier such that the relative height of the surface of the substrate with respect to the front end of the gas feeder corresponding to the substrate is capable of being adjusted.

3. The substrate processing apparatus of claim 1, wherein a plurality of gas feeders comprising the gas feeder are provided therein, the substrate retainer is further configured to support a plurality of substrates comprising the substrate, and the plurality of gas feeders are arranged at a same interval as a vertical interval of the plurality of substrates accommodated in the substrate retainer.

4. The substrate processing apparatus of claim 1, wherein a plurality of gas feeders comprising the gas feeder are provided therein, the substrate retainer is further configured to support a plurality of substrates comprising the substrate, and the gas supplier comprises a plurality of flow rate controllers configured to be capable of controlling a flow rate of the gas and provided corresponding to the plurality of gas feeders, respectively.

5. The substrate processing apparatus of claim 4, wherein each of the plurality of flow rate controllers of the gas supplier comprises:
    a first valve configured to be capable of controlling a supply of a source gas to the plurality of substrates;
    a second valve configured to be capable of controlling a supply of a reactive gas to the plurality of substrates; and
    a third valve configured to be capable of controlling a supply of a carrier gas to the plurality of substrates.

6. The substrate processing apparatus of claim 4, wherein the plurality of flow rate controllers of the gas supplier are constituted by:
    a first flow rate controller configured to be capable of controlling a flow rate of a source gas supplied to the plurality of substrates;
    a second flow rate controller configured to be capable of controlling a flow rate of a reactive gas supplied to the plurality of substrates; and
    a third flow rate controller configured to be capable of controlling a flow rate of a carrier gas supplied to the plurality of substrates.

7. The substrate processing apparatus of claim 1, wherein a plurality of gas feeders comprising the gas feeder are provided therein, the substrate retainer is further configured to support a plurality of substrates comprising the substrate, and the gas supplier comprises a plurality of flow rate controllers configured to be capable of controlling a flow rate of the gas, which are respectively in communication with the plurality of gas feeders.

8. The substrate processing apparatus of claim 7, wherein each of the flow rate controllers comprises:
    a first valve configured to be capable of controlling a supply of a source gas to the plurality of substrates;
    a second valve configured to be capable of controlling a supply of a reactive gas to the plurality of substrates; and a third valve configured to be capable of controlling a supply of a carrier gas to the plurality of substrates.

9. The substrate processing apparatus of claim 7, wherein the plurality of flow rate controllers of the gas supplier is constituted by:
- a first flow rate controller configured to be capable of controlling a flow rate of a source gas supplied to the plurality of substrates;
- a second flow rate controller configured to be capable of controlling a flow rate of a reactive gas supplied to the plurality of substrates; and
- a third flow rate controller configured to be capable of controlling a flow rate of a carrier gas supplied to the plurality of substrates.

10. The substrate processing apparatus of claim 1, wherein a plurality of gas feeders comprising the gas feeder are provided therein, the substrate retainer is further configured to support a plurality of substrates comprising the substrate, and the gas supplier comprises a valve and a flow rate controller configured to be capable of controlling a flow rate of the gas supplied to the plurality of gas feeders.

11. The substrate processing apparatus of claim 1, wherein a plurality of gas feeders comprising the gas feeder are provided therein, and the substrate retainer is further configured to support a plurality of substrates comprising the substrate,
the apparatus further comprising:
a preheating heater capable of heating each of the plurality of gas feeders.

12. The substrate processing apparatus of claim 11, wherein the controller is further configured to be capable of controlling the preheating heater to heat each of the plurality of gas feeders in accordance with a temperature of the heater.

13. The substrate processing apparatus of claim 1, wherein the gas supplier is constituted by:
- a plurality of gas feeders comprising the gas feeder through which a source gas and a reactive gas are supplied in a manner corresponding to each of a plurality of substrates comprising the substrate; and
- a carrier gas feeder through which a carrier gas is supplied into the reaction vessel accommodating the substrate retainer.

14. The substrate processing apparatus of claim 1, wherein the controller is further configured to be capable of performing a cycle a plurality of times, the cycle comprising at least supplying a source gas into the reaction vessel through the gas supplier and supplying a reactive gas into the reaction vessel through the gas supplier, and
wherein the first position and the second position in a first half of the plurality of times are controlled to be changed from the first position and the second position in a second half of the plurality of times.

15. The substrate processing apparatus of claim 1, wherein the controller is further configured to be capable of performing a cycle a plurality of times, the cycle comprising at least supplying a source gas into the reaction vessel through the gas supplier and supplying a reactive gas into the reaction vessel through the gas supplier, and
wherein the first position and the second position in at least one time among the plurality of times are controlled to be changed from those in times other than the at least one time among the plurality of times.

16. The substrate processing apparatus of claim 1, wherein a height of the gas feeder is fixed, and
wherein the controller is further configured to be capable of controlling the gas supplier and the vertical driver such that the gas is supplied to the substrate by adjusting the relative height of the surface of the substrate with respect to the front end of the gas feeder corresponding to the substrate.

17. The substrate processing apparatus of claim 1, wherein the substrate processing state at the first position and the substrate processing state at the second position are different.

18. A method of manufacturing a semiconductor device, comprising:
(a) accommodating a substrate retainer in which a substrate is supported into a reaction vessel by driving the substrate retainer by a vertical driver;
(b) heating the substrate supported in the substrate retainer accommodated in the reaction vessel by a heater provided around the reaction vessel to surround the reaction vessel;
(c) maintaining a relative height of a surface of the substrate with respect to a front end of a gas feeder corresponding to the substrate at a first position where a first film thickness distribution is obtained as a substrate processing state;
(d) supplying a gas to the substrate through the gas feeder while maintaining the relative height at the first position, wherein the gas feeder penetrates, from beside the heater, a side wall of the heater and a side wall of the reaction vessel, extends in a direction parallel to the surface of the substrate and is configured to be capable of supplying the gas to above the substrate;
(e) maintaining the relative height of the surface of the substrate with respect to the front end of the gas feeder corresponding to the substrate at a second position which is different from the first position and where a second film thickness distribution different from the first film thickness distribution is obtained as the substrate processing state;
(f) supplying the gas to the substrate through the gas feeder while maintaining the relative height at the second position; and
(g) exhausting the gas from the reaction vessel.

19. A non-transitory computer-readable recording medium storing a program that causes, by a computer, a substrate processing apparatus to perform:
(a) accommodating a substrate retainer in which a substrate is supported into a reaction vessel by driving the substrate retainer by a vertical driver;
(b) heating the substrate supported in the substrate retainer accommodated in the reaction vessel by a heater provided around the reaction vessel to surround the reaction vessel;
(c) maintaining a relative height of a surface of the substrate with respect to a front end of a gas feeder corresponding to the substrate at a first position where a first film thickness distribution is obtained as a substrate processing state;
(d) supplying a gas to the substrate through the gas feeder while maintaining the relative height at the first position, wherein the gas feeder penetrates, from beside the heater, a side wall of the heater and a side wall of the reaction vessel, extends in a direction parallel to the surface of the substrate and is configured to be capable of supplying the gas to above the substrate;
(e) maintaining the relative height of the surface of the substrate with respect to the front end of the gas feeder corresponding to the substrate at a second position which is different from the first position and where a second film thickness distribution different from the first film thickness distribution is obtained as the substrate processing state;
(f) supplying the gas to the substrate through the gas feeder while maintaining the relative height at the second position; and
(g) exhausting the gas from the reaction vessel.

* * * * *